(12) United States Patent
Itasaka et al.

(10) Patent No.: US 12,218,631 B2
(45) Date of Patent: Feb. 4, 2025

(54) CIRCUIT APPARATUS AND OSCILLATOR

(71) Applicant: SEIKO EPSON CORPORATION, Tokyo (JP)

(72) Inventors: Yosuke Itasaka, Minowa (JP); Takashi Nomiya, Matsumoto (JP); Naoki Ii, Suwa (JP)

(73) Assignee: SEIKO EPSON CORPORATION (JP)

( * ) Notice: Subject to any disclaimer, the term of this patent is extended or adjusted under 35 U.S.C. 154(b) by 12 days.

(21) Appl. No.: 18/359,234

(22) Filed: Jul. 26, 2023

(65) Prior Publication Data

US 2024/0048100 A1 Feb. 8, 2024

(30) Foreign Application Priority Data

Jul. 27, 2022 (JP) ................................. 2022-119712

(51) Int. Cl.
*H03B 5/04* (2006.01)
*H03B 5/36* (2006.01)

(52) U.S. Cl.
CPC .............. *H03B 5/04* (2013.01); *H03B 5/36* (2013.01)

(58) Field of Classification Search
CPC ...................................................... H03B 5/04
USPC ................................................... 331/66, 176
See application file for complete search history.

(56) References Cited

U.S. PATENT DOCUMENTS

| 2011/0291767 | A1* | 12/2011 | Ishikawa | H03K 3/0307 331/154 |
| 2020/0028468 | A1* | 1/2020 | Kano | H03B 5/06 |
| 2020/0244221 | A1* | 7/2020 | Ishikawa | H03B 5/366 |

FOREIGN PATENT DOCUMENTS

JP 2011-234086 A 11/2011

* cited by examiner

*Primary Examiner* — Joseph Chang
(74) *Attorney, Agent, or Firm* — Harness, Dickey & Pierce, P.L.C.

(57) ABSTRACT

A circuit apparatus includes a clock signal generation circuit configured to generate a clock signal by a resonator, an output circuit configured to operate in a first state or a second state in which a consumption current is different from that in the first state and output an output clock signal, and a temperature compensation circuit configured to compensate for a frequency-temperature characteristic of the clock signal based on a temperature detection signal. When the output circuit operates in the first state, the temperature compensation circuit outputs a first temperature compensation signal that compensates for a frequency-temperature characteristic when the output circuit operates in the first state, and the clock signal generation circuit generates a clock signal based on the first temperature compensation signal. When the output circuit operates in the second state, the temperature compensation circuit outputs a second temperature compensation signal that compensates for a frequency-temperature characteristic when the output circuit operates in the second state, and the clock signal generation circuit generates a clock signal based on the second temperature compensation signal.

13 Claims, 17 Drawing Sheets

CIRCUIT APPARATUS AND OSCILLATOR

The present application is based on, and claims priority from JP Application Serial Number 2022-119712, filed Jul. 27, 2022, the disclosure of which is hereby incorporated by reference herein in its entirety.

BACKGROUND

1. Technical Field

The present disclosure relates to a circuit apparatus, an oscillator, and the like.

2. Related Art

In a circuit apparatus that generates a clock signal by oscillating a resonator such as a quartz crystal resonator, temperature compensation for a frequency of the clock signal is performed. For example, JP-A-2011-234086 (PTL 1) discloses a piezoelectric oscillator offset circuit in which compensation for a hysteresis characteristic of a piezoelectric resonator can be performed by providing a circuit that offsets a temperature compensation voltage in a temperature direction and a circuit that offsets the temperature compensation voltage in a voltage direction.

However, PTL 1 describes the compensation for hysteresis without considering an influence of a change in a state of an output circuit of the circuit apparatus.

SUMMARY

A first aspect of the disclosure relates to a circuit apparatus including: a clock signal generation circuit configured to generate a clock signal based on an oscillation signal generated by oscillating a resonator; an output circuit configured to operate in a first state or a second state in which a consumption current is different from that in the first state and output at least one output clock signal based on the clock signal; and a temperature compensation circuit configured to compensate for a frequency-temperature characteristic of the clock signal based on a temperature detection signal from a temperature sensor. When the output circuit operates in the first state, the temperature compensation circuit outputs a first temperature compensation signal that compensates for the frequency-temperature characteristic when the output circuit operates in the first state, and the clock signal generation circuit generates the clock signal based on the first temperature compensation signal. When the output circuit operates in the second state, the temperature compensation circuit outputs a second temperature compensation signal that compensates for the frequency-temperature characteristic when the output circuit operates in the second state and that is different from the first temperature compensation signal, and the clock signal generation circuit generates the clock signal based on the second temperature compensation signal.

A second aspect of the disclosure relates to an oscillator including: a resonator; and a circuit apparatus. The circuit apparatus includes a clock signal generation circuit configured to generate a clock signal based on an oscillation signal generated by oscillating the resonator, an output circuit configured to operate in a first state or a second state in which a consumption current is different from that in the first state and output at least one output clock signal based on the clock signal, and a temperature compensation circuit configured to compensate for a frequency-temperature characteristic of the clock signal based on a temperature detection signal from a temperature sensor. When the output circuit operates in the first state, the temperature compensation circuit outputs a first temperature compensation signal that compensates for the frequency-temperature characteristic when the output circuit operates in the first state, and the clock signal generation circuit generates the clock signal based on the first temperature compensation signal. When the output circuit operates in the second state, the temperature compensation circuit outputs a second temperature compensation signal that compensate for the frequency-temperature characteristic when the output circuit operates in the second state and that is different from the first temperature compensation signal, and the clock signal generation circuit generates the clock signal based on the second temperature compensation signal.

DESCRIPTION OF EMBODIMENTS

Hereinafter, an embodiment will be described. The embodiment to be described below does not unduly limit contents described in the claims. In addition, all of the components described in the embodiment are not necessarily essential components.

1. Circuit Apparatus

Figure 1:
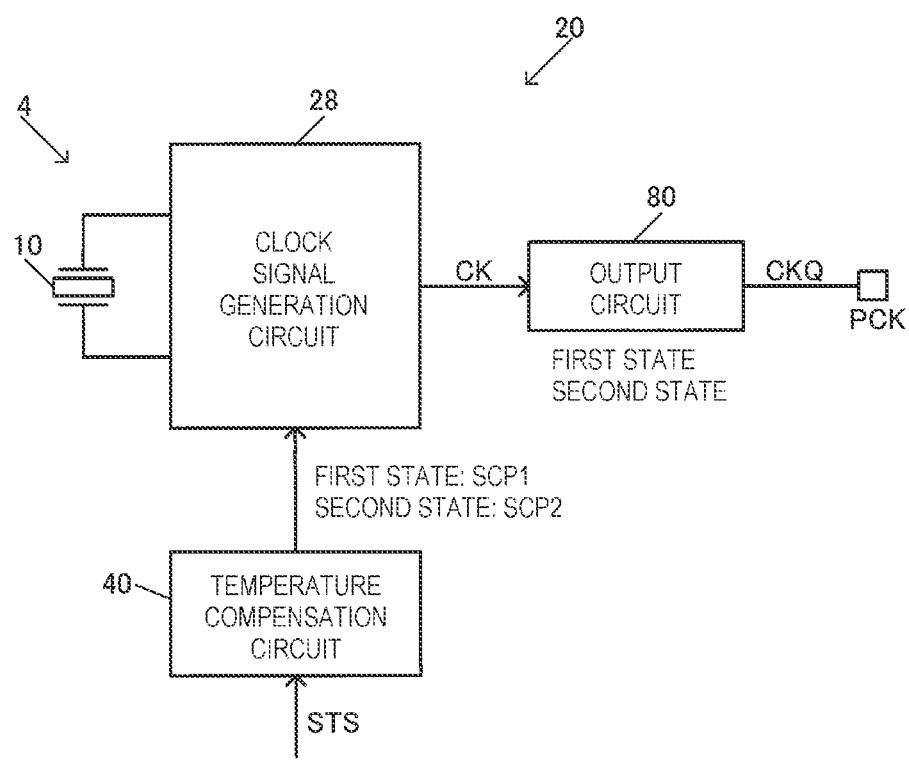
FIG. 1 shows a configuration example of a circuit apparatus and an oscillator according to an embodiment.

FIG. 1 shows a configuration example of a circuit apparatus 20 according to the embodiment. The circuit apparatus 20 according to the embodiment includes a clock signal generation circuit 28, a temperature compensation circuit 40, and an output circuit 80. In addition, an oscillator 4 according to the embodiment includes a resonator 10 and the circuit apparatus 20. The resonator 10 is electrically coupled to the circuit apparatus 20.

The resonator 10 is an element that generates mechanical oscillation by an electric signal. The resonator 10 may be implemented by a resonator element such as a quartz crystal resonator element. For example, the resonator 10 may be implemented by a quartz crystal resonator element that has a cut angle of AT cut or SC cut and performs thickness-shear vibration, a tuning fork type quartz crystal resonator element, or a double tuning fork type quartz crystal resonator element. For example, the resonator 10 may be a resonator in a temperature-compensated quartz crystal oscillator (TCXO) including no thermostatic oven or may be a resonator in an oven-controlled quartz crystal oscillator (OCXO) including a thermostatic oven. The resonator 10 according to the embodiment may also be implemented by various resonator elements such as a resonator element other than a thickness-shear vibrating type, a tuning fork type or a double tuning fork type, or a piezoelectric resonator element made of a material other than quartz crystal. For example, a surface acoustic wave (SAW) resonator, or a micro electro mechanical systems (MEMS) resonator as a silicon resonator formed using a silicon substrate may be adopted as the resonator 10.

The circuit apparatus 20 is an integrated circuit apparatus called an integrated circuit (IC). For example, the circuit apparatus 20 is an IC manufactured by a semiconductor process and is a semiconductor chip in which a circuit element is formed on a semiconductor substrate. The circuit apparatus 20 according to the embodiment may be implemented by two or more semiconductor chips.

The clock signal generation circuit 28 is a circuit that generates a clock signal CK by using the resonator 10. Specifically, the clock signal generation circuit 28 generates the clock signal CK based on an oscillation signal generated by oscillating the resonator 10. For example, the clock signal generation circuit 28 includes an oscillation circuit that oscillates the resonator 10, and generates the clock signal CK based on an oscillation signal generated by the oscillation circuit. Alternatively, a signal generation circuit such as a PLL circuit that generates the clock signal CK having a frequency obtained by multiplying a frequency of the oscillation signal may be provided at a subsequent stage of the oscillation circuit, and the clock signal generation circuit 28 may output the clock signal CK generated by the signal generation circuit.

The output circuit 80 receives the clock signal CK and outputs an output clock signal CKQ. For example, the output circuit 80 buffers the clock signal CK as the output clock signal CKQ and outputs the output clock signal CKQ to a pad PCK of the circuit apparatus 20. Accordingly, the output clock signal CKQ is output to the outside via the pad PCK. For example, the output circuit 80 can output the output clock signal CKQ in various signal formats. For example, the output circuit 80 may output the output clock signal CKQ in a single-end CMOS signal format or may output the output clock signal CKQ in a signal format other than CMOS. For example, the output circuit 80 may output the differential output clock signal CKQ to the outside in a signal format such as low voltage differential signaling (LVDS), positive emitter coupled logic (PECL), high speed current steering logic (HCSL), or differential complementary MOS (CMOS).

In the embodiment, the output circuit 80 operates in a first state or a second state in which a consumption current is different from that in the first state, and outputs at least one output clock signal CKQ based on the clock signal CK. For example, the consumption current when the output circuit 80 operates in the second state and outputs the output clock signal CKQ is larger or smaller than the consumption current when the output circuit 80 operates in the first state. The first state and the second state of the output circuit 80 are each a state of an operation mode of the output circuit 80, a state of an external load to which the output clock signal CKQ is output, or the like. For example, the output circuit 80 can operate in any one of two or more states including the first state and the second state, and, for example, may operate in a third state in which a consumption current is different from those in the first state and the second state. In addition, in FIG. 1, the output circuit 80 outputs one output clock signal CKQ based on the clock signal CK, and may also output a plurality of output clock signals as will be described later.

The temperature compensation circuit 40 is a circuit for performing temperature compensation for a clock frequency. Specifically, the temperature compensation circuit 40 compensates for a frequency-temperature characteristic of the clock signal CK based on a temperature detection signal STS from a temperature sensor (not shown). The temperature sensor may be implemented by, for example, a temperature detection circuit of the circuit apparatus 20, or may be implemented by a temperature detection element provided in the vicinity of the semiconductor chip of the circuit apparatus 20. In addition, a plurality of temperature sensors may be used. In addition, the temperature compensation is a process of restraining and compensating for a clock frequency fluctuation caused by a temperature fluctuation. That is, the temperature compensation circuit 40 performs the temperature compensation for the clock frequency of the clock signal generation circuit 28 such that a frequency of the clock signal CK is constant even when there is a temperature fluctuation. For example, the temperature compensation circuit 40 may perform the temperature compensation for the clock frequency by performing temperature compensation for an oscillation frequency of the oscillation circuit provided in the clock signal generation circuit 28 or may perform the temperature compensation for the clock frequency by performing a temperature compensation process on the PLL circuit provided in the clock signal generation circuit 28. For example, the temperature compensation circuit 40 performs the temperature compensation for the clock frequency by outputting a temperature compensation voltage to a variable capacitance circuit of the oscillation circuit or performs the temperature compensation for the clock frequency by setting a frequency divider ratio setting signal of the PLL circuit.

In the embodiment, the temperature compensation circuit 40 generates a first temperature compensation signal SCP1 corresponding to the first state of the output circuit 80 and a second temperature compensation signal SCP2 corresponding to the second state of the output circuit 80, and outputs these temperature compensation signals to the clock signal generation circuit 28. The clock signal generation circuit 28 generates the clock signal CK temperature-compensated based on the first temperature compensation signal SCP1 or the second temperature compensation signal SCP2 from the temperature compensation circuit 40. The temperature compensation circuit 40 can generate two or more temperature compensation signals including the first temperature compensation signal SCP1 or the second temperature compensation signal SCP2 and may generate, for example, a third temperature compensation signal corresponding to the third state of the output circuit 80.

Specifically, as shown in FIG. 1, when the output circuit 80 operates in the first state, the temperature compensation circuit 40 outputs the first temperature compensation signal SCP1 that compensates for the frequency-temperature characteristic when the output circuit 80 operates in the first state. For example, the temperature compensation circuit 40 generates and outputs the first temperature compensation signal SCP1 to restrain a fluctuation of the clock frequency caused by a temperature fluctuation when the output circuit 80 operates in the first state and the consumption current is a first consumption current. The clock signal generation circuit 28 generates the clock signal CK based on the first temperature compensation signal SCP1 generated in this manner.

On the other hand, when the output circuit 80 operates in the second state, the temperature compensation circuit 40 outputs the second temperature compensation signal SCP2 that compensates for the frequency-temperature characteristic when the output circuit 80 operates in the second state and that is different from the first temperature compensation signal SCP1. For example, the temperature compensation circuit 40 generates and outputs the second temperature compensation signal SCP2 to restrain a fluctuation of the clock frequency caused by a temperature fluctuation when the output circuit 80 operates in the second state and the consumption current is a second consumption current. The clock signal generation circuit 28 generates the clock signal CK based on the second temperature compensation signal SCP2 generated in this manner.

In this way, according to the embodiment, when the output circuit 80 operates in the first state and the consumption current of the circuit apparatus 20 is the first consumption current, the temperature compensation circuit 40 generates the first temperature compensation signal SCP1 corresponding to the first state. For example, the temperature compensation circuit 40 generates the first temperature compensation signal SCP1 that compensates for the frequency-temperature characteristic when the first consumption current flows and a first heat generation state occurs.

The clock signal generation circuit 28 generates the clock signal CK temperature-compensated based on the first temperature compensation signal SCP1. On the other hand, when the output circuit 80 operates in the second state and the consumption current of the circuit apparatus 20 is the second consumption current different from the first consumption current, the temperature compensation circuit 40 generates the second temperature compensation signal SCP2 corresponding to the second state. For example, the temperature compensation circuit 40 generates the second temperature compensation signal SCP2 that compensates for the frequency-temperature characteristic when the second consumption current flows and a second heat generation state occurs. The clock signal generation circuit 28 generates the clock signal CK temperature-compensated based on the second temperature compensation signal SCP2. In this way, when the output circuit 80 operates in the first state, the first consumption current flows and the first heat generation state occurs, the clock signal CK temperature-compensated based on the first temperature compensation signal SCP1 for the first heat generation state can be generated. In addition, when the output circuit 80 operates in the second state, the second consumption current flows and the second heat generation state occurs, the clock signal CK temperature-compensated based on the second temperature compensation signal SCP2 for the second heat generation state can be generated. Therefore, compensation for the frequency-temperature characteristic of the clock signal CK can be performed by an appropriate temperature compensation signal corresponding to the state of the output circuit 80, and the frequency-temperature characteristic of the output clock signal CKQ can be improved.

In the circuit apparatus 20 that oscillates the resonator 10 and outputs the output clock signal CKQ, when the state of the output circuit 80 is changed, the consumption current of the circuit apparatus 20 is changed and an amount of generated heat is changed. When the amount of heat generated by the circuit apparatus 20 is changed, a temperature-compensated frequency deviates due to, for example, a temperature difference between a temperature sensor 48 and the resonator 10 to be described later. Therefore, temperature compensation according to the heat generation state of the circuit apparatus 20 is required.

Figure 2:
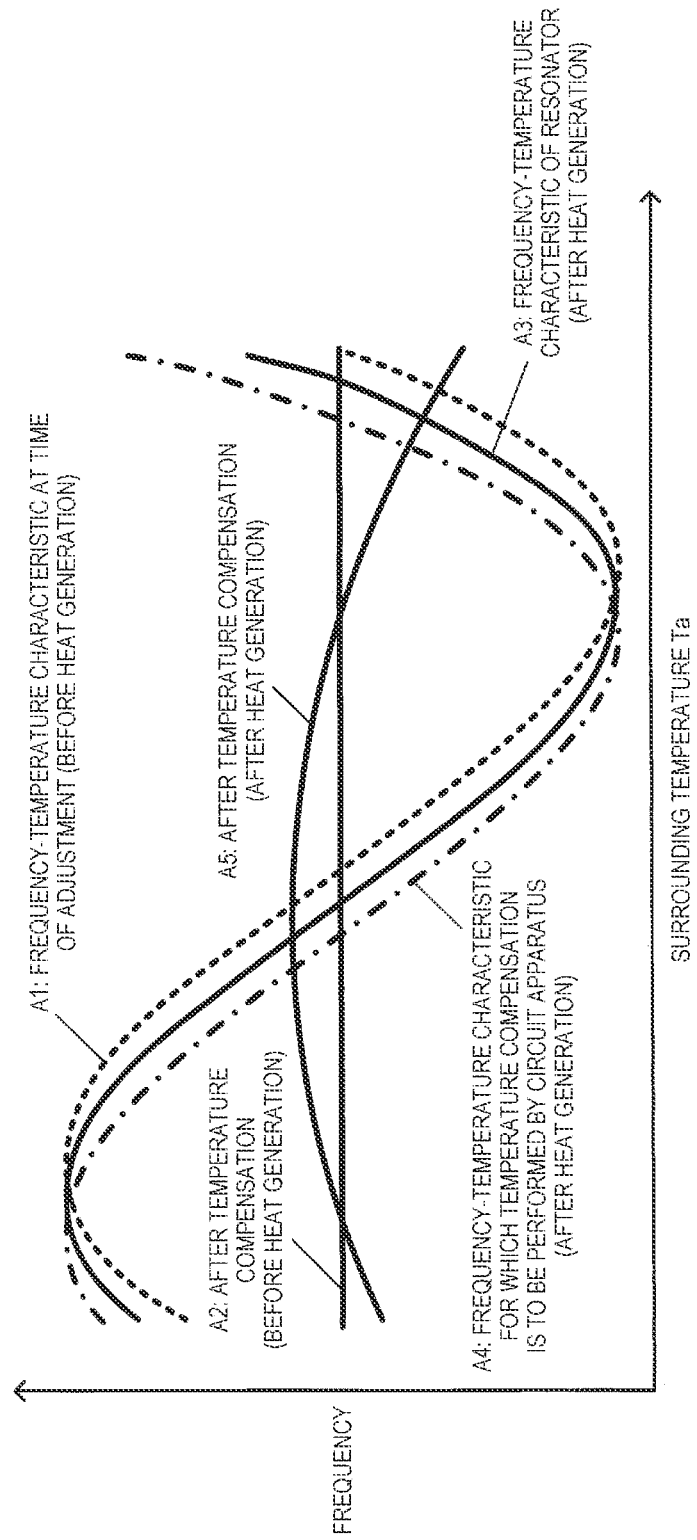
FIG. 2 is an explanatory diagram showing a frequency-temperature characteristic before and after heat generation.

For example, FIG. 2 is an explanatory diagram showing frequency-temperature characteristics before and after heat generation. A1 in FIG. 2 is a clock signal frequency-temperature characteristic at the time of adjustment and is a frequency-temperature characteristic before heat generation. At the time of manufacturing and inspection of the circuit apparatus 20 and the oscillator 4, for example, the frequency-temperature characteristic is measured, and a temperature compensation process coefficient is determined such that the frequency-temperature characteristic is flat as indicated by A2.

However, when the heat generation state is changed due to the change in the state of the output circuit 80, the frequency-temperature characteristic of the resonator 10 is as indicated by A3, whereas a frequency-temperature characteristic for which temperature compensation is to be performed by the circuit apparatus 20 is as indicated by A4, and thus there is a deviation therebetween. Due to this deviation, as indicated by A5, the frequency-temperature characteristic after the temperature compensation is not flat, and was, for example, a quadratic function characteristic.

For example, the circuit apparatus 20 generates heat due to power consumption, and thus a temperature $Tj1$ thereof is higher than an atmospheric temperature Ta. In addition, a temperature of the resonator 10 such as a quartz crystal resonator is stabilized at a temperature $Tx1$ between the temperature $Tj1$ of the circuit apparatus 20 and the atmospheric temperature Ta. For example, when the state of the output circuit 80 is changed from the first state to the second state and thus the temperature of the circuit apparatus 20 is changed from $Tj1$ to $Tj2$, the temperature of the resonator 10 is also changed from $Tx1$ to $Tx2$. At this time, if $Tj2-Tj1=Tx2-Tx1$, temperature compensation is performed in the same way as a change in Ta. However, in practice, since $Tj2-Tj1>Tx2-Tx1$, a deviation occurs as indicated by A3 and A4 in FIG. 2, and the frequency-temperature characteristic of the clock signal is the characteristic as indicated by A5.

For example, when $\Delta T=Tj2-Tx2$, the frequency-temperature characteristic after temperature compensation has a frequency deviation in a quadratic coefficient characteristic as indicated in the following equation (1). The temperature compensation signal may also include a high-order coefficient including a quaternary component or a quintic component, and since the quaternary or higher-order coefficient is smaller than a cubic or lower-order coefficient, the quaternary or higher-order coefficient is omitted in the following equation (1) for simplification.

$$\underbrace{\frac{}{d \cdot Tx2^3 + c \cdot Tx2^2 + b \cdot Tx2 + a}}_{B1} \qquad (1)$$

$$\underbrace{-\{d \cdot (Tx2 + \Delta T)^3 + c \cdot (Tx2 + \Delta T)^2 + b \cdot (Tx2 + \Delta T) + a\}}_{B2} =$$

$$\underbrace{-3d \cdot \Delta T \cdot Tx2^2 - (3d \cdot \Delta T^2 + 2c \cdot \Delta T) \cdot Tx2 - (d \cdot \Delta T^3 + c \cdot \Delta T^2 + b \cdot \Delta T)}_{B3}$$

For example, in equation (1), a term B1 corresponds to the frequency-temperature characteristic of the resonator 10 after heat generation and corresponds to A3 in FIG. 2. In addition, a term B2 corresponds to the frequency-temperature characteristic for which compensation is to be performed by the circuit apparatus 20 after heat generation, and corresponds to A4 in FIG. 2. Therefore, as indicated by B3 in the equation (1), there is a frequency deviation in a quadratic coefficient characteristic in the frequency-temperature characteristic.

In this regard, in the embodiment, when the state of the output circuit 80 is changed from the first state to the second state and the temperature difference ΔT occurs, the temperature compensation signal is switched from the first temperature compensation signal SCP1 to the second temperature compensation signal SCP2. The second temperature compensation signal SCP2 is used to perform temperature compensation for flattening the quadratic coefficient characteristic that is a quadratic function characteristic of A2 in FIG. 2. For example, temperature compensation is performed to eliminate the term indicated by B3 in the equation (1). For example, the temperature compensation circuit 40 generates the second temperature compensation signal SCP2 having a quadratic coefficient characteristic different from that of the first temperature compensation signal SCP1 with respect to the temperature, thereby enabling such temperature compensation. The first temperature compensation signal SCP1 and the second temperature compensation signal SCP2 may at least have different quadratic coefficient characteristics, and may also have different characteristics of other orders. As shown in FIG. 2 as an example, the temperature compensation circuit 40 generates the second temperature compensation signal SCP2 that brings the frequency-temperature characteristic indicated by A4 close to the frequency-temperature characteristic indicated by A3. Such an operation can be implemented by the temperature compensation circuit 40 by generating the second temperature compensation signal SCP2 obtained by shifting the first temperature compensation signal SCP1 in a temperature direction. In this way, even when the output circuit 80 is changed from the first state to the second state and the heat generation state is changed, the appropriately temperature-compensated output clock signal CKQ can be output.

2. Analog Temperature Compensation

Figure 3:
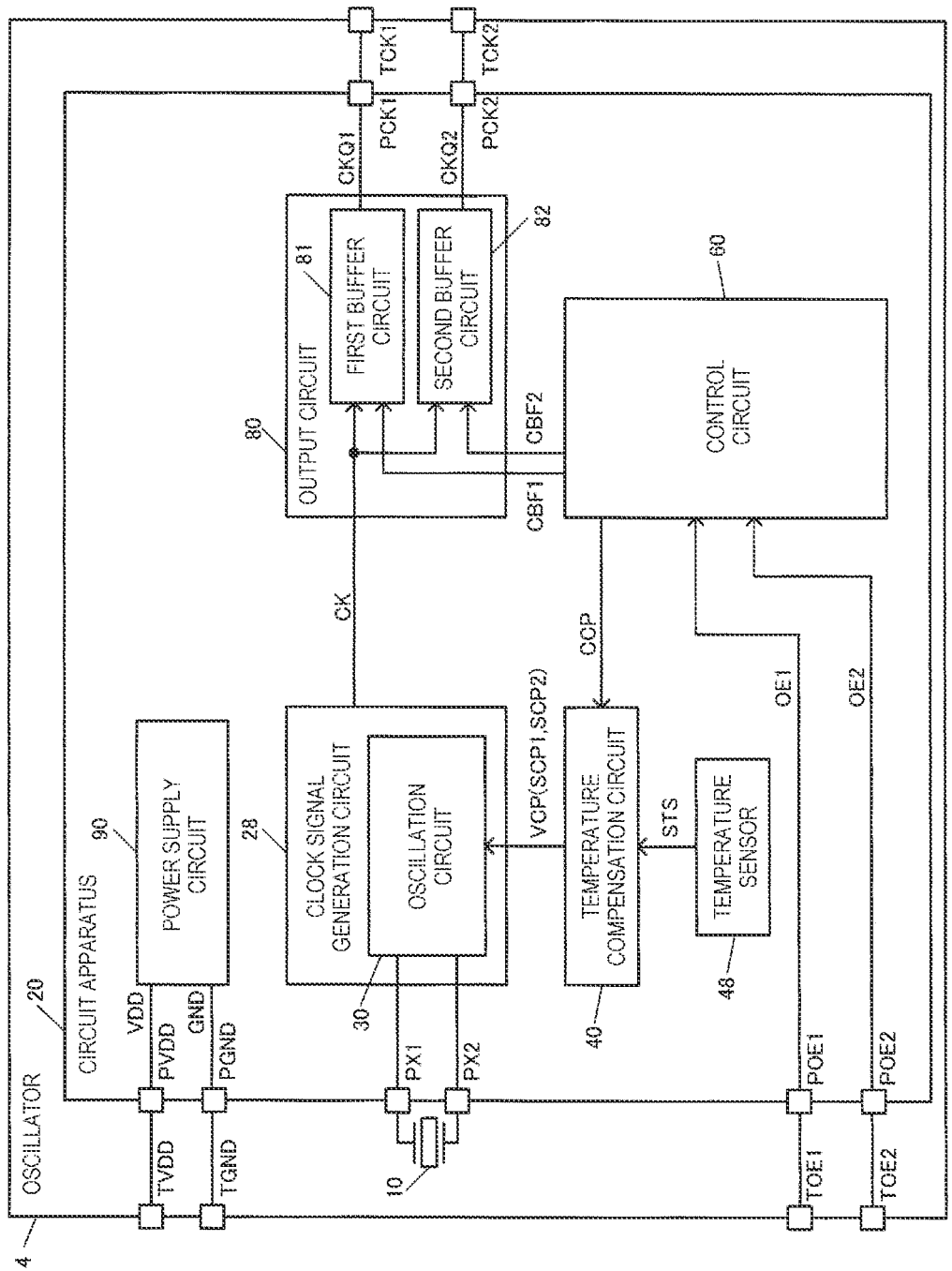
FIG. 3 shows a detailed configuration example of the circuit apparatus and the oscillator according to the embodiment.

FIG. 3 shows a detailed configuration example of the circuit apparatus 20 and the oscillator 4 according to the embodiment. In FIG. 3, the temperature compensation circuit 40 implements the temperature compensation for the clock frequency by performing temperature compensation for an oscillation frequency of an oscillation circuit 30 in an analog manner. Specifically, the circuit apparatus 20 in FIG. 3 includes the clock signal generation circuit 28, the temperature compensation circuit 40, the temperature sensor 48, a control circuit 60, the output circuit 80, and a power supply circuit 90. The clock signal generation circuit 28 includes the oscillation circuit 30, and the output circuit 80 includes a first buffer circuit 81 and a second buffer circuit 82. In addition, the oscillator 4 includes the resonator 10 and the circuit apparatus 20, and the resonator 10 is electrically coupled to the circuit apparatus 20. For example, the resonator 10 and the circuit apparatus 20 are electrically coupled by an internal wiring, a bonding wire, or a metal bump of a package that accommodates the resonator 10 and the circuit apparatus 20. The circuit apparatus 20 and the oscillator 4 are not limited to the configuration in FIG. 3, and various modifications can be made, such as omitting a part of components, adding other components, or replacing a part of components with other components. The same applies to other detailed configuration examples to be described later.

The circuit apparatus 20 includes pads PVDD, PGND, PX1, PX2, POE1, POE2, PCK1, and PCK2. The pads are terminals of the circuit apparatus 20 which is a semiconductor chip. For example, in a pad area, a metal layer is exposed from a passivation film that is an insulating layer, and the exposed metal layer constitutes a pad that is a terminal of the circuit apparatus 20. The pads PVDD and PGND are a power supply pad and a ground pad, respectively. A power supply voltage VDD from an external power supply device is supplied to the pad PVDD. The pad PGND is a pad to which GND, which is a ground voltage, is supplied. The GND can also be called VSS, and the ground voltage is, for example, a ground potential. In the embodiment, the ground is appropriately described as the GND. For example, the VDD corresponds to a high-potential-side power supply, and the GND corresponds to a low-potential-side power supply. The pads PX1 and PX2 are pads for coupling to the resonator 10. The pads POE1 and POE2 are pads for inputting a first enable control signal OE1 and a second enable control signal OE2. The pads PCK1 and PCK2 are pads for outputting a first output clock signal CKQ1 and a second output clock signal CKQ2. The pads PVDD, PGND, POE1, POE2, PCK1, and PCK2 are electrically coupled to terminals TVDD, TGND, TOE1, TOE2, TCK1, and TCK2, respectively, which are external terminals for external coupling of the oscillator 4. For example, each pad and each terminal are electrically coupled by using an internal wiring, a bonding wire, or a metal bump of a package.

In FIG. 3, the clock signal generation circuit 28 includes the oscillation circuit 30, and outputs the clock signal CK based on an oscillation signal generated by the oscillation circuit 30. The oscillation circuit 30 is a circuit that oscillates the resonator 10. For example, the oscillation circuit 30 generates the oscillation signal by oscillating the resonator 10. The oscillation signal is an oscillation clock signal. For example, the oscillation circuit 30 may be implemented by an oscillation drive circuit electrically coupled to one end and the other end of the resonator 10 and a passive element such as a capacitor or a resistor. The drive circuit may be implemented by, for example, a CMOS inverter circuit or a bipolar transistor. The drive circuit is a core circuit of the oscillation circuit 30. The drive circuit drives the resonator 10 by a voltage or a current to oscillate the resonator 10. As the oscillation circuit 30, various types of oscillation circuits such as an inverter type, a Pierce type, a Colpitts type, or a Hartley type can be used. The oscillation circuit 30 is electrically coupled to the resonator 10 via the pads PX1 and PX2. The pads PX1 and PX2 are resonator coupling pads. The oscillation drive circuit of the oscillation circuit 30 is provided between the pad PX1 and the pad PX2. In addition, the oscillation circuit 30 is provided with a variable capacitance circuit, and an oscillation frequency can be adjusted by adjusting a capacitance of the variable capacitance circuit. The variable capacitance circuit may be implemented by a variable capacitance element such as a varactor. For example, the variable capacitance circuit may be implemented by a variable capacitance element whose capacitance is controlled based on the temperature compensation voltage VCP which is a temperature compensation signal. Alternatively, the variable capacitance circuit may be implemented by a capacitor array and a switch array coupled to the capacitor array. In this case, the capacitance of the variable capacitance circuit is controlled by turning on or off a plurality of switches provided in the switch array by, for example, a digital control signal. The coupling in the embodiment is electrical coupling. The electrical coupling is coupling through which an electrical signal can be transmitted and coupling through which information can be transmitted by the electrical signal. The electrical coupling may be coupling via a passive element or the like.

The temperature compensation circuit 40 performs temperature compensation for the oscillation frequency of the oscillation circuit 30. For example, the temperature compensation circuit 40 outputs, based on a temperature detection voltage that is the temperature detection signal STS of the temperature sensor 48, the temperature compensation voltage VCP for performing temperature compensation for the oscillation frequency of the oscillation circuit 30.

Specifically, in FIG. 3, the temperature compensation circuit 40 performs analog temperature compensation by, for example, polynomial approximation. For example, when the temperature compensation voltage VCP for compensating for the frequency-temperature characteristic of the resonator 10 is approximated by a polynomial, the temperature compensation circuit 40 performs analog temperature compensation based on coefficient information of the polynomial. The analog temperature compensation is temperature compensation implemented by, for example, an addition process of a current signal or a voltage signal that is an analog signal. For example, when the temperature compensation voltage VCP is approximated by a high-order polynomial, a zeroth-order coefficient, a linear coefficient, and a high-order coefficient of the polynomial are stored as zeroth-order correction data, linear correction data, and high-order correction data, respectively, in a memory (not shown) implemented by, for example, a nonvolatile memory. The high-order coefficient is, for example, a coefficient of a high-order larger than a first order, and the high-order correction data is correction data corresponding to the high-order coefficient. For example, when the temperature compensation voltage VCP is approximated by a cubic polynomial, a zeroth-order coefficient, a linear coefficient, a quadratic coefficient, and a cubic coefficient of the polynomial are stored as zeroth-order correction data, linear correction data, quadratic correction data, and cubic correction data in the memory that is a storage unit. The temperature compensation circuit 40 performs temperature compensation based on the zeroth-order correction data to the cubic correction data. In this case, the quadratic correction data and temperature compensation based on the quadratic correction data may be omitted. In addition, for example, when the temperature compensation voltage VCP is approximated by a quintic polynomial, a zeroth-order coefficient, a linear coefficient, a quadratic coefficient, a cubic coefficient, a quaternary coefficient, and a quintic coefficient of the polynomial are stored in the memory as zeroth-order correction data, linear correction data, quadratic correction data, cubic correction data, quaternary correction data, and quintic correction data. The temperature compensation circuit 40 performs temperature compensation based on the zeroth-order correction data to the quintic correction data. In this case, the quadratic correction data or the quaternary correction data, and temperature compensation based on the quadratic correction data or the quaternary correction data may be omitted. In addition, an order of the polynomial approximation may be any order, and, for example, polynomial approximation of an order higher than a fifth order may be performed. In addition, zeroth-order correction may also be performed by the temperature sensor 48.

The temperature sensor 48 is a sensor that detects a temperature. Specifically, the temperature sensor 48 outputs, as the temperature detection signal STS, a temperature-dependent voltage that changes according to an environment temperature. The temperature detection signal STS is, for example, a temperature detection voltage. For example, the temperature sensor 48 generates the temperature detection signal STS by using a circuit element having temperature dependence. Specifically, by utilizing, for example, temperature dependence of a forward voltage of a PN junction, the temperature sensor 48 outputs, as the temperature detection signal STS, a temperature detection voltage that is a voltage changing depending on the temperature. A modification using a digital temperature sensor circuit as the temperature sensor 48 can also be implemented. In this case, temperature detection data may be subjected to D/A conversion to generate the temperature detection voltage.

The control circuit 60 is, for example, a logic circuit and performs various control processes. For example, the control circuit 60 controls the entire circuit apparatus or controls an operation sequence of the circuit apparatus 20. In addition, the control circuit 60 performs various processes for controlling the oscillation circuit controls the temperature compensation circuit 40, the temperature sensor 48, the output circuit 80, or the power supply circuit 90, or controls reading and writing of information from and to a memory (not shown). The control circuit 60 may be implemented by a circuit of an application specific integrated circuit (ASIC) based on automatic placement and wiring such as a gate array.

The output circuit 80 buffers and outputs the clock signal CK output by the clock signal generation circuit 28 based on the oscillation signal of the oscillation circuit 30. For example, the output circuit 80 buffers the clock signal CK and outputs the buffered clock signal CK as the first output clock signal CKQ1 to the pad PCK1. In addition, the output circuit 80 buffers the clock signal CK and outputs the buffered clock signal CK as the second output clock signal CKQ2 to the pad PCK2. For example, the output circuit 80 includes the first buffer circuit 81 and the second buffer circuit 82, the first buffer circuit 81 outputs the first output clock signal CKQ1, and the second buffer circuit 82 outputs the second output clock signal CKQ2. The output circuit 80 outputs two output clock signals in FIG. 3, and may also output three or more output clock signals.

The power supply circuit 90 is supplied with the power supply voltage VDD from the pad PVDD or the ground voltage GND from the pad PGND, and supplies various power supply voltages for internal circuits of the circuit apparatus 20 to the internal circuits. For example, the power supply circuit 90 supplies a regulated power supply voltage obtained by regulating the power supply voltage VDD to each circuit of the circuit apparatus 20 such as the oscillation circuit 30.

Figure 4:
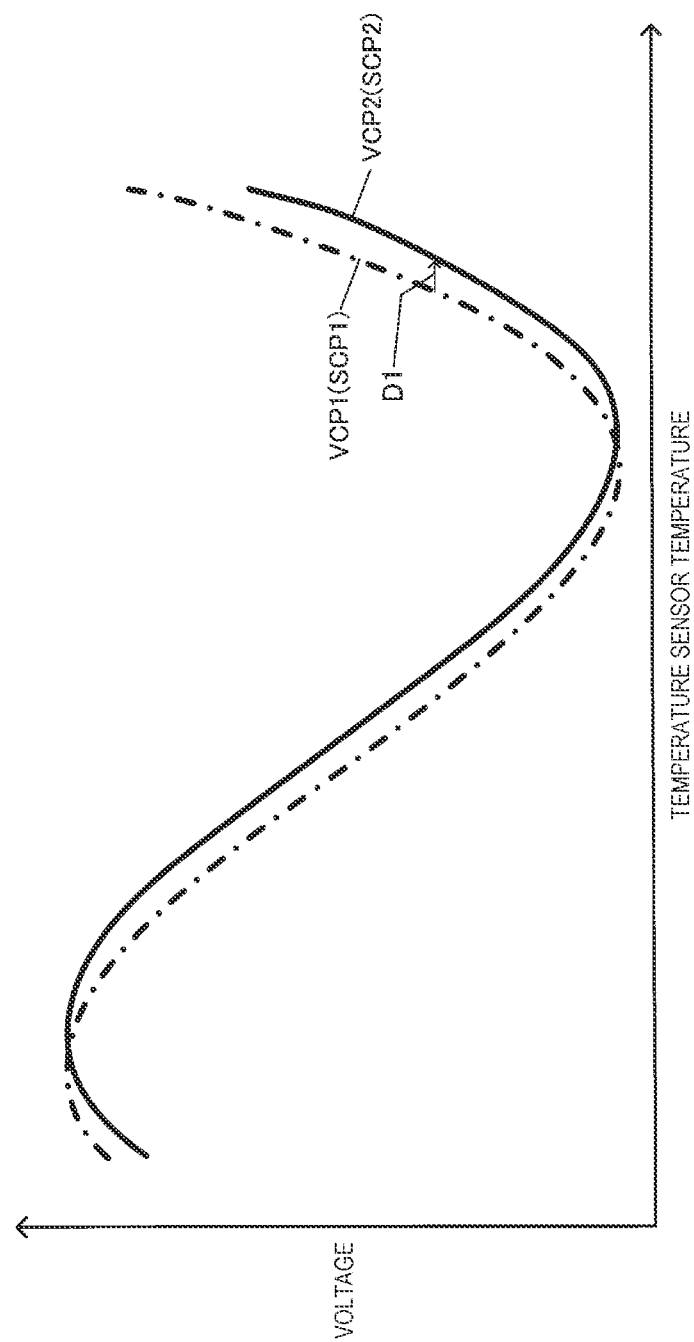
FIG. 4 is an explanatory diagram showing a method for generating a temperature compensation signal.

In this way, in FIG. 3, the clock signal generation circuit 28 includes the oscillation circuit 30 that generates the oscillation signal by oscillating the resonator 10. The temperature compensation circuit 40 is a temperature compensation circuit that performs analog temperature compensation as described above and outputs the temperature compensation voltage VCP of the oscillation signal to the oscillation circuit 30 as the first temperature compensation signal SCP1 and the second temperature compensation signal SCP2. For example, when the output circuit 80 operates in the first state, the temperature compensation circuit 40 outputs a first temperature compensation voltage VCP1 that compensates for the frequency-temperature characteristic when the output circuit 80 operates in the first state. On the other hand, when the output circuit 80 operates in the second state, the temperature compensation circuit 40 outputs a second temperature compensation voltage VCP2 that compensates for the frequency-temperature characteristic when the output circuit operates in the second state and that is different from the first temperature compensation voltage VCP1. For example, as shown in FIG. 4, the first temperature compensation voltage VCP1 and the second temperature compensation voltage VCP2 have different voltage-temperature characteristics. For example, the voltage-temperature characteristic of the second temperature compensation voltage VCP2 is a voltage-temperature characteristic obtained by shifting the first temperature compensation voltage VCP1 in the temperature direction as indicated by D1 in FIG. 4. For example, switching from the first temperature compensation voltage VCP1 to the second temperature compensation voltage VCP2 is performed based on a control signal CCP from the control circuit 60. As an example, when the control signal CCP is at a first voltage level, the temperature compensation circuit 40 outputs the first temperature compensation voltage VCP1 having a first voltage-temperature characteristic as the temperature compensation voltage VCP. On the other hand, when the control signal CCP is at a second voltage level, the temperature compensation circuit 40 outputs the second temperature compensation voltage VCP2 having a second voltage-temperature characteristic different from the first voltage-temperature characteristic as the temperature compensation voltage VCP.

In this way, the temperature compensation circuit 40 can perform temperature compensation for the oscillation frequency in an analog manner by outputting the temperature compensation voltage VCP as the first temperature compensation signal SCP1 and the second temperature compensation signal SCP2 to the oscillation circuit 30 that oscillates the resonator 10. Accordingly, the temperature-compensated clock signal CK can be generated. When the output circuit 80 is in the first state, the first temperature compensation voltage VCP1 is output to the oscillation circuit 30 as the first temperature compensation signal SCP1. When the output circuit 80 is in the second state, the second temperature compensation voltage VCP2 is output to the oscillation circuit 30 as the second temperature compensation signal SCP2. In this way, even when the output circuit 80 is changed from the first state to the second state and the heat generation state is changed, appropriate temperature compensation for the oscillation signal can be performed, and the appropriately temperature-compensated output clock signal can be output.

The circuit apparatus 20 according to the embodiment includes the control circuit 60 which receives at least one external control signal and switches the output circuit 80 between the first state and the second state based on the external control signal. As shown in FIG. 3 as an example, the control circuit 60 receives the first enable control signal OE1 and the second enable control signal OE2 as the external control signal and switches the operation state of the output circuit 80 based on the external control signal. The external control signal is a signal input from outside the circuit apparatus 20 and is a signal for switching the state of the output circuit 80. The external control signal is generated and output by, for example, a processing apparatus outside the circuit apparatus 20. The external control signal in FIG. 3 is the first enable control signal OE1 and the second enable control signal OE2, and as will be described later in other detailed examples, the external control signal is not limited to such enable control signals. For example, when the output circuit 80 is switched from the first state to the second state based on the external control signal, the temperature compensation circuit 40 switches the temperature compensation signal from the first temperature compensation signal SCP1 to the second temperature compensation signal SCP2 based on the control signal CCP from the control circuit 60. As shown in FIG. 3 as an example, the temperature compensation circuit 40 switches the temperature compensation voltage from the first temperature compensation voltage VCP1 having the first voltage-temperature characteristic to the second temperature compensation voltage VCP2 having the second voltage-temperature characteristic.

In this way, even when the output circuit 80 is switched from the first state to the second state by the external control signal and the heat generation state is changed, the appropriately temperature-compensated output clock signal can be output. For example, the temperature compensation signal can be switched in conjunction with the external control signal, and a deviation in the temperature compensation caused by the change in the state of the output circuit 80 due to the control of the external control signal can be appropriately corrected.

More specifically, in FIG. 3, the control circuit 60 receives the first enable control signal OE1 and the second enable control signal OE2 as at least one external control signal. The first enable control signal OE1 is a signal for controlling enabling and disenabling of output of the first output clock signal CKQ1, and the second enable control signal OE2 is a signal for controlling enabling and disenabling of output of the second output clock signal CKQ2. When the first enable control signal is active, the output circuit 80 outputs the first output clock signal CKQ1 as at least one output clock signal. On the other hand, when the second enable control signal is active, the output circuit 80 outputs the second output clock signal CKQ2 as at least one output clock signal. Here, the signal being active means that the signal is at the first voltage level such as a high level, and the signal being inactive means that the signal is at the second voltage level such as a low level. In addition, it is also possible to control enabling and disenabling of the first output clock signal CKQ1 and the second output clock signal CKQ2 by one enable control signal. In addition, clock frequencies of the first output clock signal CKQ1 and the second output clock signal CKQ2 may be the same frequency or different frequencies. In addition, the first output clock signal CKQ1 and the second output clock signal CKQ2 may be signals of the same signal format or signals of different signal formats. For example, the first output clock signal CKQ1 may have any one signal format of LVDS, PECL, HCSL, single CMOS, and differential CMOS, and the second output clock signal CKQ2 may have a signal format different from any one of such signal formats.

In this way, when the first enable control signal OE1 that is the external control signal is active, the first output clock signal CKQ1 is output from the circuit apparatus 20. When the second enable control signal OE2 that is the external control signal is active, the second output clock signal CKQ2 is output from the circuit apparatus 20. When the state of the output circuit 80 is changed and the heat generation state is changed due to setting of the first enable control signal OE1 and the second enable control signal OE2, the temperature compensation circuit 40 outputs the temperature compensation signal corresponding to the state of the output circuit 80 to the clock signal generation circuit 28. Accordingly, it is possible to perform appropriate temperature compensation for the clock frequency according to the state of the output circuit 80. For example, the temperature compensation signal can be switched in conjunction with the enable control signal of the output clock signal, and a deviation in the temperature compensation caused by the change in the state of the output circuit 80 due to the control of the enable control signal can be appropriately corrected.

The first state of the output circuit 80 is, for example, a state in which the first output clock signal CKQ1 is output. On the other hand, the second state of the output circuit 80 is, for example, a state in which both the first output clock signal CKQ1 and the second output clock signal CKQ2 are output. For example, when the first enable control signal OE1 is active and the second enable control signal OE2 is inactive, the state of the output circuit 80 is set to the first state in which the first output clock signal CKQ1 is output and the second output clock signal CKQ2 is not output. The temperature compensation circuit 40 outputs the first temperature compensation signal SCP1 corresponding to the first state, and outputs the first output clock signal CKQ1 temperature-compensated based on the first temperature compensation signal SCP1. In addition, when both the first enable control signal OE1 and the second enable control signal OE2 are active, the state of the output circuit 80 is set to the second state in which both the first output clock signal CKQ1 and the second output clock signal CKQ2 are output. The temperature compensation circuit 40 outputs the second temperature compensation signal SCP2 corresponding to the second state, and the first output clock signal CKQ1 and the second output clock signal CKQ2 temperature-compensated based on the second temperature compensation signal SCP2 are output.

In this way, in the first state in which the first output clock signal CKQ1 is output, the temperature compensation circuit 40 outputs the first temperature compensation signal SCP1 corresponding to the first state, and the first output clock signal CKQ1 temperature-compensated based on the first temperature compensation signal SCP1 is output. When the state is switched from the first state to the second state in which both the first output clock signal CKQ1 and the second output clock signal CKQ2 are output, the temperature compensation circuit 40 switches the temperature compensation signal from the first temperature compensation signal SCP1 corresponding to the first state to the second temperature compensation signal SCP2 corresponding to the second state and outputs the second temperature compensation signal SCP2. The first output clock signal CKQ1 and the second output clock signal CKQ2 temperature-compensated based on the second temperature compensation signal SCP2 are output.

For example, in the second state in which the first output clock signal CKQ1 and the second output clock signal CKQ2 are output, an amount of heat generated by the output circuit 80 is larger than that in the first state in which only the first output clock signal CKQ1 is output. Since it is necessary to drive a large load outside the oscillator 4 due to the output clock signal, the output circuit 80 has a large consumption current and generates a larger amount of heat than other circuit blocks of the circuit apparatus 20. Therefore, as shown in FIG. 2, there is a deviation in temperature compensation due to a temperature difference between the resonator 10 and the circuit apparatus 20.

In this respect, in the embodiment, in the first state in which the amount of generated heat is small, temperature compensation is performed based on the first temperature compensation signal SCP1, and in the second state in which the amount of generated heat is large, temperature compensation is performed based on the second temperature compensation signal SCP2 having a signal temperature characteristic different from that of the first temperature compensation signal SCP1. Therefore, for example, the temperature compensation circuit 40 outputs the first temperature compensation signal SCP1 and the second temperature compensation signal SCP2 as shown in FIG. 4, so that the deviation in the temperature compensation caused by the temperature difference between the resonator 10 and the circuit apparatus 20 can be appropriately corrected.

For example, in a processing system using the oscillator 4, only the first output clock signal CKQ1 may be used in a first operation mode, and both the first output clock signal CKQ1 and the second output clock signal CKQ2 may be used in a second operation mode. Specifically, in the first operation mode, the first output clock signal CKQ1 is used as an operation clock signal of a processing apparatus such as a microcomputer of the processing system. In the second operation mode, the first output clock signal CKQ1 is used as the operation clock signal of the processing apparatus, and the second output clock signal CKQ2 is used as a clock signal of an RF circuit or the like of the processing system. In this way, in the first operation mode, the output circuit 80 does not need to output the second output clock signal CKQ2, and thus power consumption can be reduced. On the other hand, even when the operation mode is the second operation mode, both the first output clock signal CKQ1 and the second output clock signal CKQ2 are output, and the amount of generated heat increases, temperature compensation is performed based on the second temperature compensation signal SCP2 according to the second state corresponding to the second operation mode, and thus the first output clock signal CKQ1 and the second output clock signal CKQ2 that are appropriately temperature-compensated can be supplied to the external processing system.

As shown in FIG. 3, the output circuit 80 includes the first buffer circuit 81 and the second buffer circuit 82. The first buffer circuit 81 and the second buffer circuit 82 may output the first output clock signal CKQ1 and the second output clock signal CKQ2 having the same frequency, or may output the first output clock signal CKQ1 and the second output clock signal CKQ2 having different frequencies. The first buffer circuit 81 and the second buffer circuit 82 may output the first output clock signal CKQ1 and the second output clock signal CKQ2 of the same signal format, or may output the first output clock signal CKQ1 and the second output clock signal CKQ2 of different signal formats. The first buffer circuit 81 outputs the first output clock signal CKQ1 based on the clock signal CK. For example, the first buffer circuit 81 buffers the clock signal CK and outputs the buffered clock signal CK as the first output clock signal CKQ1 to the pad PCK1. The second buffer circuit 82 outputs the second output clock signal CKQ2 based on the clock signal CK. For example, the second buffer circuit 82 buffers the clock signal CK and outputs the buffered clock signal CK as the second output clock signal CKQ2 to the pad PCK2.

In the first state of the output circuit 80, the first buffer circuit 81 outputs the first output clock signal CKQ1. For example, when the first enable control signal OE1 is active, the control circuit 60 activates a control signal CBF1 of the first buffer circuit 81, so that the first buffer circuit 81 outputs the first output clock signal CKQ1. On the other hand, in the second state of the output circuit 80, the first buffer circuit 81 outputs the first output clock signal CKQ1, and the second buffer circuit 82 outputs the second output clock signal CKQ2. For example, when the first enable control signal OE1 and the second enable control signal OE2 are active, the control circuit 60 activates the control signal CBF1 of the first buffer circuit 81 and a control signal CBF2 of the second buffer circuit 82, so that the first buffer circuit 81 outputs the first output clock signal CKQ1 and the second buffer circuit 82 outputs the second output clock signal CKQ2.

In this way, when the output circuit 80 is in the first state, the first buffer circuit 81 outputs the first output clock signal CKQ1 based on the clock signal CK temperature-compensated based on the first temperature compensation signal SCP1 from the temperature compensation circuit 40. Accordingly, the appropriately temperature-compensated first output clock signal CKQ1 can be output to the outside. On the other hand, when the output circuit 80 is in the second state, the first buffer circuit 81 outputs the first output clock signal CKQ1, and the second buffer circuit 82 outputs the second output clock signal CKQ2 based on the clock signal CK temperature-compensated based on the second temperature compensation signal SCP2 from the temperature compensation circuit 40. Accordingly, it is possible to output the first output clock signal CKQ1 and the second output clock signal CKQ2 that are appropriately temperature-compensated to the outside. That is, as compared with the first state in which only the first buffer circuit 81 operates, in the second state in which the first buffer circuit 81 and the second buffer circuit 82 operate, the consumption current is increased and the amount of heat generated is increased, and thus there is a deviation in temperature compensation. In this regard, in the embodiment, in the second state in which the first buffer circuit 81 and the second buffer circuit 82 operate, the temperature compensation is performed based on the second temperature compensation signal SCP2 corresponding to the second state, and thus it is possible to output the first output clock signal CKQ1 and the second output clock signal CKQ2 that are appropriately temperature-compensated.

Figure 5:
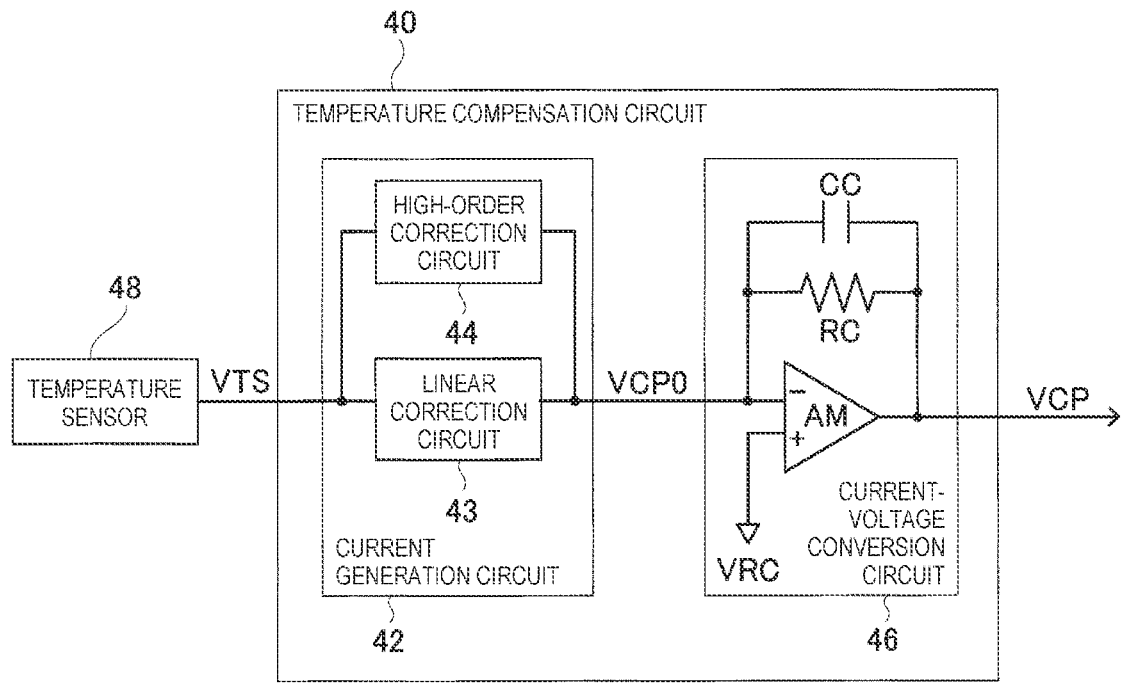
FIG. 5 shows a configuration example of a temperature compensation circuit.

FIG. 5 shows a configuration example of the temperature compensation circuit 40. FIG. 5 shows the temperature compensation circuit 40 that performs analog temperature compensation. The temperature compensation circuit 40 is not limited to the configuration in FIG. 5, and various modifications may be implemented, such as omitting a part of components, adding other components, or replacing a part of components with other components. The temperature compensation circuit 40 is a circuit that outputs the temperature compensation voltage VCP by polynomial approximation using the temperature as a variable. The temperature compensation circuit 40 includes a current generation circuit 42 and a current-voltage conversion circuit 46. The current generation circuit 42 generates, based on a temperature detection voltage VTS that is the temperature detection signal STS from the temperature sensor 48, a function current for temperature compensation for the frequency-temperature characteristic of the resonator 10. The current-voltage conversion circuit 46 converts the function current from the current generation circuit 42 into a voltage and outputs the temperature compensation voltage VCP. Specifically, the current-voltage conversion circuit 46 outputs the temperature compensation voltage VCP by an amplifier circuit AM.

The current generation circuit 42 includes a linear correction circuit 43 and a high-order correction circuit 44. The linear correction circuit 43 outputs, based on the temperature detection voltage VTS, a linear current approximating a linear function. For example, the linear correction circuit 43 outputs a linear function current based on linear correction data corresponding to a linear coefficient of a polynomial in the polynomial approximation. The linear correction circuit 43 includes, for example, an operational amplifier, a first variable resistance circuit, a second variable resistance circuit, and a third variable resistance circuit. The operational amplifier, the first variable resistance circuit, and the second variable resistance circuit constitute the amplifier circuit. The amplifier circuit amplifies the temperature detection voltage VTS with reference to a reference voltage, for example. The amplifier circuit outputs the linear current to an input node of the current-voltage conversion circuit 46 via the third variable resistance circuit.

The high-order correction circuit 44 outputs, based on the temperature detection voltage VTS, a high-order current approximating a high-order function to the current-voltage conversion circuit 46. For example, the high-order correction circuit 44 outputs a high-order current based on high-order correction data corresponding to a high-order coefficient of the polynomial in the polynomial approximation. As an example, the high-order correction circuit 44 outputs a cubic current approximating a cubic function. In this case, the high-order correction circuit 44 includes a first differential circuit that performs a differential operation based on the temperature detection voltage VTS, and a second differential circuit that performs a differential operation based on an output voltage of the first differential circuit and the temperature detection voltage VTS to output the cubic current. In FIG. 5, the temperature sensor 48 performs offset correction of the temperature detection voltage VTS based on zeroth-order correction data corresponding to a zeroth-order coefficient of the polynomial. That is, the temperature sensor 48 adjusts an offset of the temperature detection voltage VTS based on an offset indicated by the zeroth-order correction data. The offset correction of the temperature detection voltage VTS corresponds to zeroth-order correction in the temperature compensation for the oscillation frequency. In addition, the high-order correction circuit 44 may further include a correction circuit that performs quaternary or higher-order correction. For example, the high-order correction circuit 44 may further include a quaternary correction circuit that outputs a quaternary current approximating a quaternary function and a quintic correction circuit that outputs a quintic current approximating a quintic function.

The current-voltage conversion circuit 46 adds the linear current to the high-order current and performs current-voltage conversion on the sum current to output the temperature compensation voltage VCP. Accordingly, the temperature compensation voltage VCP approximating a polynomial function is generated.

The current-voltage conversion circuit 46 includes the amplifier circuit AM, a resistor RC, and a capacitor CC. The amplifier circuit AM is implemented by the operational amplifier. The resistor RC and the capacitor CC are coupled in parallel between an output terminal and an inverting input terminal of the amplifier circuit AM. A reference voltage VRC is input to a non-inverting input terminal of the amplifier circuit AM. Accordingly, the current-voltage conversion circuit 46 outputs the temperature compensation voltage VCP by, for example, the amplifier circuit AM in a class A operation.

According to the temperature compensation circuit 40 having such a configuration, the function current generated by the current generation circuit 42 based on the temperature detection voltage VTS of the temperature sensor 48 can be converted into a voltage by the current-voltage conversion circuit 46 and output as the temperature compensation voltage VCP.

Figure 6:
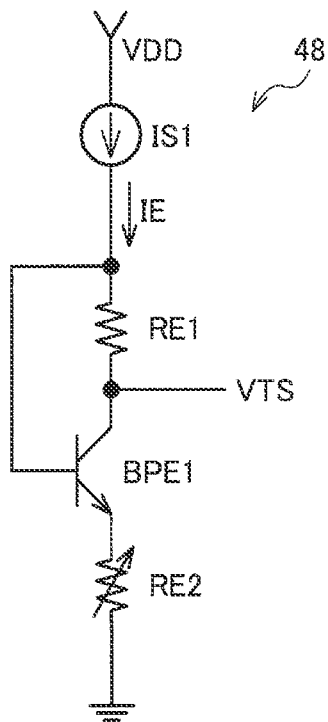
FIG. 6 shows a first configuration example of a temperature sensor.

FIG. 6 shows a first configuration example of the temperature sensor 48. The temperature sensor 48 includes a constant current source IS1, a bipolar transistor BPE1, and resistors RE1 and RE2. The constant current source IS1, the resistor RE1, the bipolar transistor BPE1, and the resistor RE2 are provided in series between a VDD node and a GND node. Specifically, a coupling node between the constant current source IS1 and one end of the resistor RE1 is coupled to a base of the bipolar transistor BPE1, and the other end of the resistor RE1 is coupled to a collector of the bipolar transistor BPE1. In addition, an emitter of the bipolar transistor BPE1 is coupled to one end of the resistor RE2, and the other end of the resistor RE2 is coupled to the GND node. The resistor RE2 is a variable resistor, and a resistance value of the resistor RE2 is set based on, for example, zeroth-order correction data.

The temperature detection voltage VTS is expressed by the following equation (2), in which a current flowing from the constant current source IS1 in FIG. 6 is represented by IE, resistance values of the resistors RE1 and RE2 are represented by R1 and R2, respectively, and a base-emitter voltage of the bipolar transistor BPE1 is represented by VBE1.

$$VTS = VBE1 + IE \times (R2 - R1) \quad (2)$$

As shown in the equation (2), the temperature detection voltage VTS includes IE×(R2−R1) as an offset component. That is, an offset of the temperature detection voltage VTS can be adjusted by changing the resistance value R2 of the resistor RE2.

Figure 7:
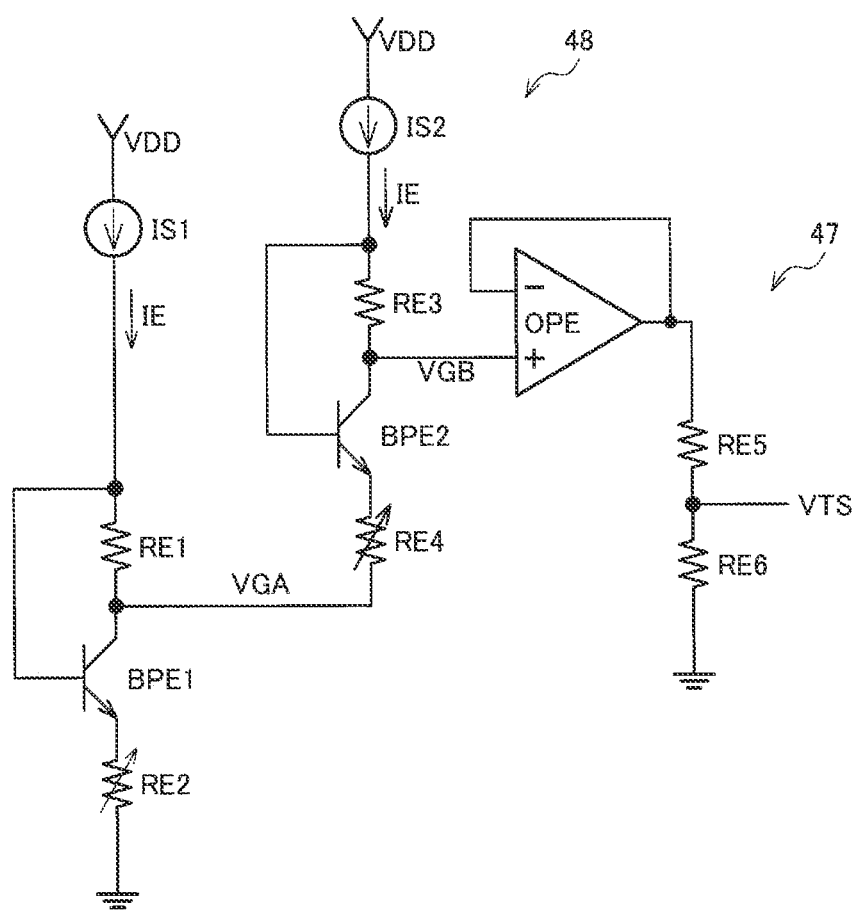
FIG. 7 shows a second configuration example of the temperature sensor.

FIG. 7 shows a second configuration example of the temperature sensor 48. The temperature sensor 48 in FIG. 7 includes constant current sources IS1 and IS2, bipolar transistors BPE1 and BPE2, and resistors RE1, RE2, RE3, and RE4. In addition, in FIG. 7, the temperature sensor 48 includes a buffer circuit 47. In the first configuration example in FIG. 6, the buffer circuit 47 that buffers the temperature detection voltage VTS may also be provided.

A configuration for coupling the constant current source IS1, the bipolar transistor BPE1, and the resistors RE1 and RE2 is the same as that in the first configuration example in FIG. 6. The constant current source IS2, the resistor RE3, the bipolar transistor BPE2, and the resistor RE4 are provided in series between the VDD node and a node of the collector of the bipolar transistor BPE1. Specifically, a coupling node between the constant current source IS2 and one end of the resistor RE3 is coupled to a base of the bipolar transistor BPE2, and the other end of the resistor RE3 is coupled to a collector of the bipolar transistor BPE2. In addition, an emitter of the bipolar transistor BPE2 is coupled to one end of the resistor RE4, and the other end of the resistor RE4 is coupled to the collector of the bipolar transistor BPE1. The resistor RE4 is a variable resistor, and a resistance value of the resistor RE4 is set based on zeroth-order correction data from a memory such as a nonvolatile memory.

The buffer circuit 47 includes an operational amplifier OPE and resistors RE5 and RE6. A voltage VGB that is a collector voltage of the bipolar transistor BPE2 is input to a non-inverting input terminal of the operational amplifier OPE. An inverting input terminal of the operational amplifier OPE is coupled to one end of the resistor RE5, the other end of the resistor RE5 is coupled to one end of the resistor RE6, and the other end of the resistor RE6 is coupled to the GND node. Accordingly, a voltage obtained by subjecting an output voltage of the operational amplifier OPE to voltage division by the resistors RE5 and RE6 is output as the temperature detection voltage VTS from a coupling node between the resistors RE5 and RE6. The output voltage of the operational amplifier OPE is a voltage obtained by adding an offset voltage of the operational amplifier OPE to the voltage VGB.

In FIG. 7, collector voltages of the bipolar transistors BPE1 and BPE2 are VGA and VGB, a current flowing from the constant current sources IS1 and IS2 is IE, and resistance values of the resistors RE1, RE2, RE3, RE4, RE5, and RE6 are R1, R2, R3, R4, R5, and R6, respectively. In addition, base-emitter voltages of the bipolar transistors BPE1 and BPE2 are represented by VBE1 and VBE2. Accordingly, voltages of VGA, VGB, and VTS are expressed by the following equations (3), (4), and (5). Here, the offset voltage of the operational amplifier OPE is zero.

$$VGA = VBE1 + IE \times (2R2 - R1) \quad (3)$$

$$VGB = VBE2 + IE \times (R4 - R3) + VGA = VBE1 + VBE2 + IE \times (2R2 + R4 - R1 - R3) \quad (4)$$

$$VTS = (R5/R6) \times VGB \quad (5)$$

As shown in the equations (4) and (5), VGB includes IE×(2R2+R4−R1−R3) as an offset component, and the temperature detection voltage VTS also includes (R5/R6)×IE×(2R2+R4−R1−R3) as an offset component. That is, the offset of the temperature detection voltage VTS can be adjusted by changing the resistance value R2 of the resistor RE2 and the resistance value R4 of the resistor RE4. In addition, in the second configuration example in FIG. 7, the two bipolar transistors BPE1 and BPE2 are provided, and thus the two base-emitter voltages VBE1 and VBE2 are added. Accordingly, as compared with the first configuration example in FIG. 6, a slope of the temperature detection voltage VTS with respect to the temperature can be increased, and the temperature detection voltage VTS having high sensitivity to the temperature can be generated. In addition, in FIG. 7, by providing the buffer circuit 47 and adjusting the resistance values of the resistors RE5 and RE6 of the buffer circuit 47, the voltage value of the temperature detection voltage VTS can be finely adjusted.

Figure 8:
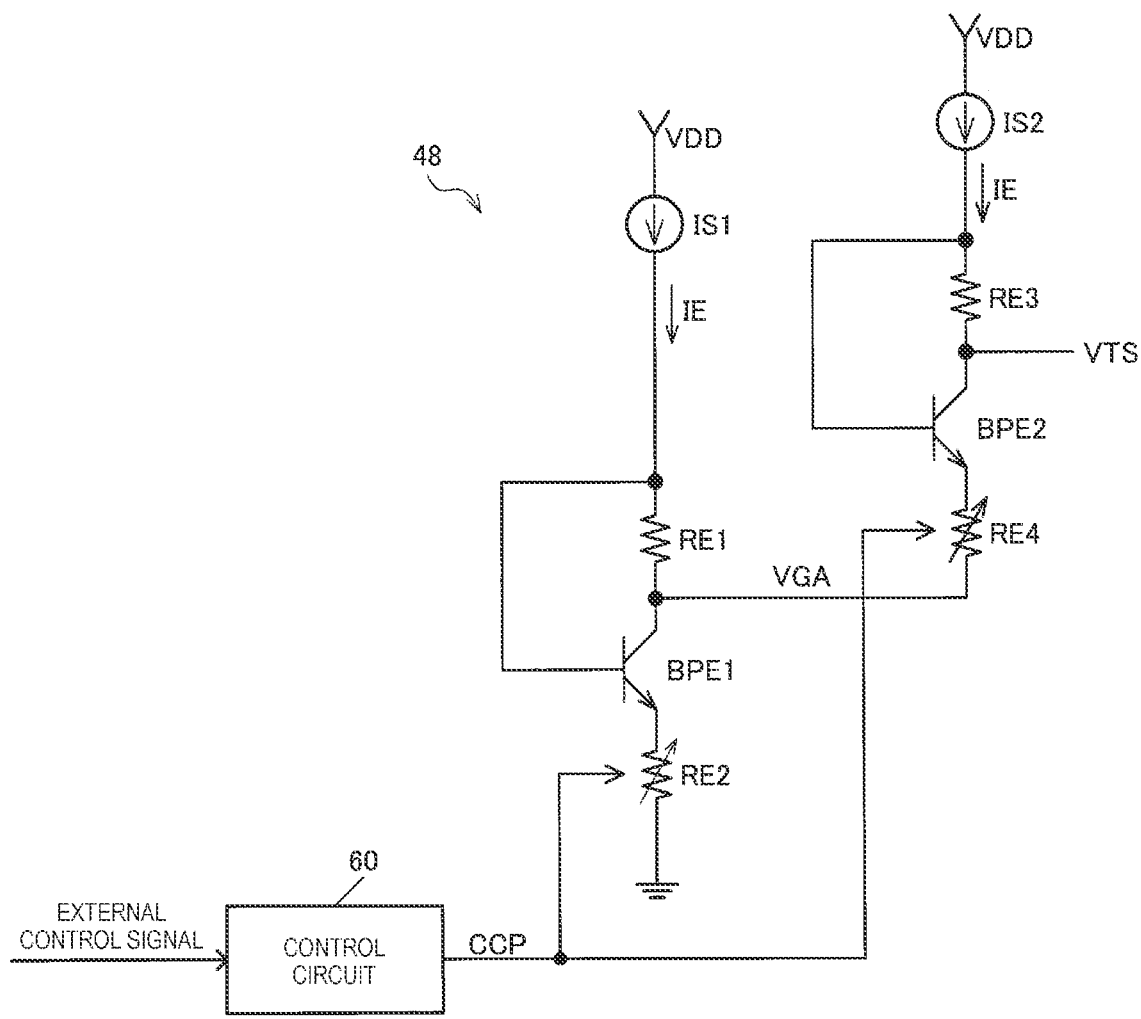
FIG. 8 is an explanatory diagram showing correction of temperature compensation by an offset of a temperature detection voltage.

FIG. 8 is an explanatory diagram showing a method for correcting temperature compensation by the offset of the temperature detection voltage VTS. In FIG. 8, an external control signal is input to the control circuit 60. The external control signal is, for example, the first enable control signal OE1 or the second enable control signal OE2 in FIG. 3 or an external control signal described in other detailed examples to be described later. The control circuit 60 changes, based on the external control signal, the resistance values R2 and R4 of the resistors RE2 and RE4 of the temperature sensor 48 shown in FIGS. 6 and 7. That is, as described in the equations (2) to (5), since the offset of the temperature detection voltage VTS can be adjusted by changing the resistance values R2 and R4 of the resistors RE2 and RE4, the control circuit 60 can change the temperature detection voltage VTS based on the external control signal to correct the deviation in the temperature compensation.

For example, in the embodiment, as shown in FIG. 4, the temperature compensation circuit 40 generates the second temperature compensation signal SCP2 having the characteristic different from that of the first temperature compensation signal SCP1 by shifting the first temperature compensation signal SCP1 in the temperature direction. For example, the signal temperature characteristic of the second temperature compensation signal SCP2 is obtained by shifting the signal temperature characteristic of the first temperature compensation signal SCP1 in the temperature direction. A shift amount in the temperature direction corresponds to, for example, $\Delta T$ which is the temperature difference between the resonator 10 and the circuit apparatus 20. For example, when a temperature is detected by the temperature sensor 48 of the circuit apparatus 20, the detected temperature is different from an actual temperature of the resonator 10. Therefore, when the output circuit 80 is changed from the first state to the second state, temperature compensation may be performed based on the second temperature compensation signal SCP2 obtained by shifting the first temperature compensation signal SCP1 in the temperature direction by the shift amount corresponding to the temperature difference between the resonator 10 and the circuit apparatus 20 at that time.

In this way, when the output circuit 80 is in the first state, the clock frequency can be temperature-compensated based on the first temperature compensation signal SCP1. When the output circuit 80 is changed from the first state to the second state and the heat generation state is changed, the clock frequency can be appropriately temperature-compensated based on the second temperature compensation signal SCP2 obtained by shifting the first temperature compensation signal SCP1 in the temperature direction as indicated by D1 in FIG. 4.

Specifically, when the output circuit 80 is in the second state, the temperature compensation circuit 40 generates the second temperature compensation signal SCP2 by offsetting the temperature detection signal STS from the temperature sensor 48, thereby generating the second temperature compensation signal SCP2 obtained by shifting the first temperature compensation signal SCP1 in the temperature direction. For example, it is assumed that the temperature detection signal STS is the temperature detection voltage VTS, the first temperature compensation signal SCP1 is the first temperature compensation voltage VCP1, and the second temperature compensation signal SCP2 is the second temperature compensation voltage VCP2. In this case, the second temperature compensation voltage VCP2 obtained by shifting the first temperature compensation voltage VCP1 in the temperature direction can be generated by performing offset adjustment of adding the offset voltage to the temperature detection voltage VTS. As shown in FIG. 8 as an example, when the output circuit 80 is changed from the first state to the second state based on the external control signal, the control circuit 60 adjusts the offset voltage of the temperature detection voltage VTS by changing the resistance values R2 and R4 of the resistors RE2 and RE4 based on the control signal CCP. Accordingly, the second temperature compensation voltage VCP2 obtained by shifting the first temperature compensation voltage VCP1 in the temperature direction can be generated.

In this way, the second temperature compensation signal SCP2 obtained by shifting the first temperature compensation signal SCP1 in the temperature direction is generated by a simple process of offsetting the temperature detection signal STS from the temperature sensor 48, and the deviation in the temperature compensation caused by the change in the heat generation state due to the change of the output circuit 80 from the first state to the second state can be appropriately corrected.

Figure 9:
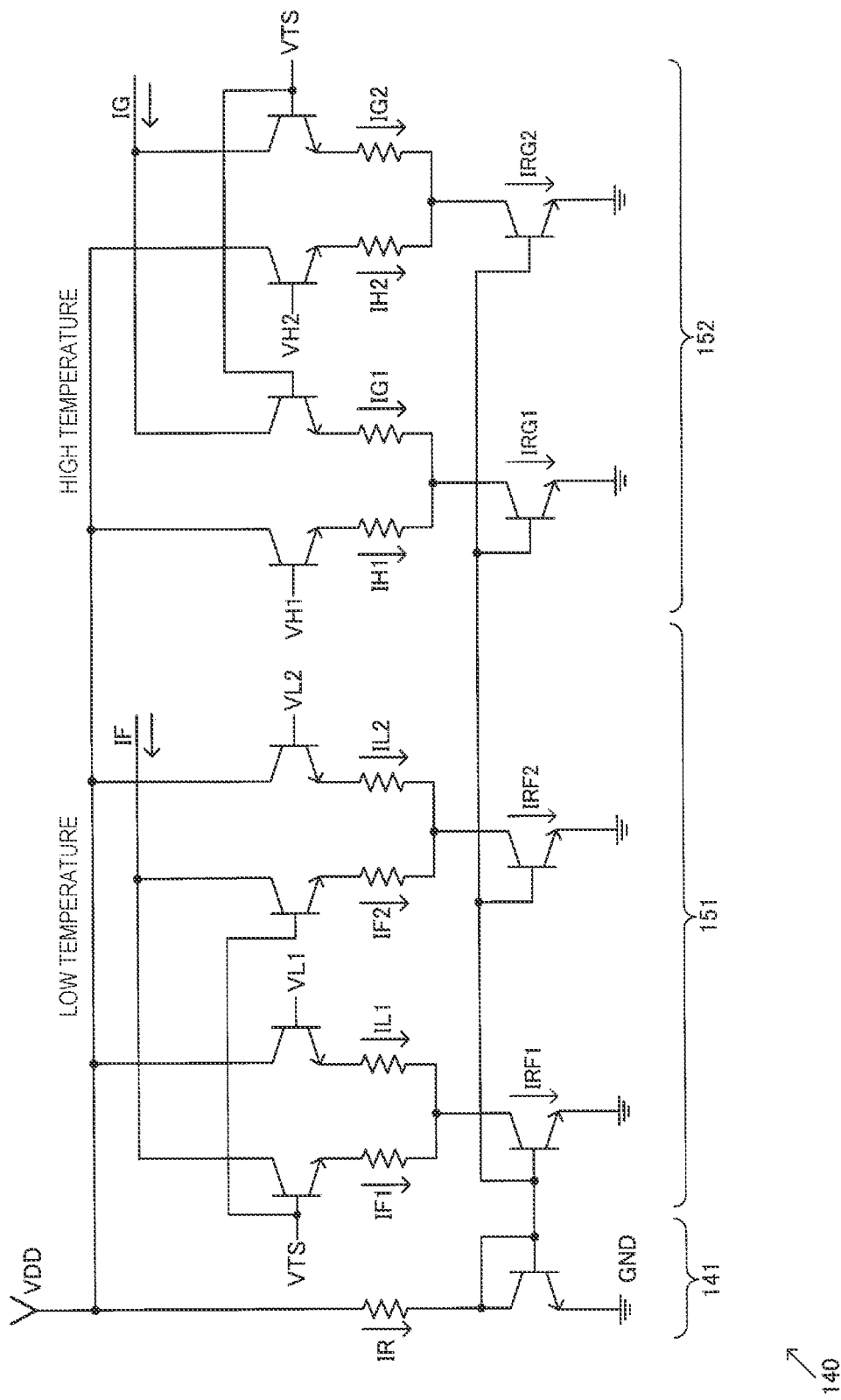
FIG. 9 shows a configuration example of a function current generation circuit.

FIG. 9 is a configuration example of a function current generation circuit 140 in the temperature compensation circuit 40. The function current generation circuit 140 is provided, for example, in the high-order correction circuit 44 in FIG. 5, and generates a high-order function current such as a quadratic or cubic function current.

As shown in FIG. 9, the function current generation circuit 140 includes a reference current generation circuit 141, a first compensation circuit 151, and a second compensation circuit 152. The reference current generation circuit 141 generates a reference current IR. The first compensation circuit 151 performs temperature compensation in a low-temperature range that is a first temperature range, and the second compensation circuit 152 performs temperature compensation in a high-temperature range that is a second temperature range. The first compensation circuit 151 and the second compensation circuit 152 include a plurality of differential pair circuits. Reference currents IRF1 and IRF2 obtained by mirroring the reference current IR flow through the differential pair circuits of the first compensation circuit 151. Reference currents IRG1 and IRG2 obtained by mirroring the reference current IR flow in the differential pair circuits of the second compensation circuit 152. The first compensation circuit 151 generates a temperature compensation current IF=IF1+IF2 in the low-temperature range. The second compensation circuit 152 generates a temperature compensation current IG=IG1+IG2 in the high-temperature range. In addition, since the reference current IR is a constant current, the reference current IRF1=IF1+IL1 and the reference current IRF2=IF2+IL2 flowing through the differential pair circuits of the first compensation circuit 151 are also constant currents having constant current values. In addition, the reference current IRG1=IG1+IH1 and the reference current IRG2=IG2+IH2 flowing through the differential pair circuits of the second compensation circuit 152 are also constant currents having constant current values.

Figure 10:
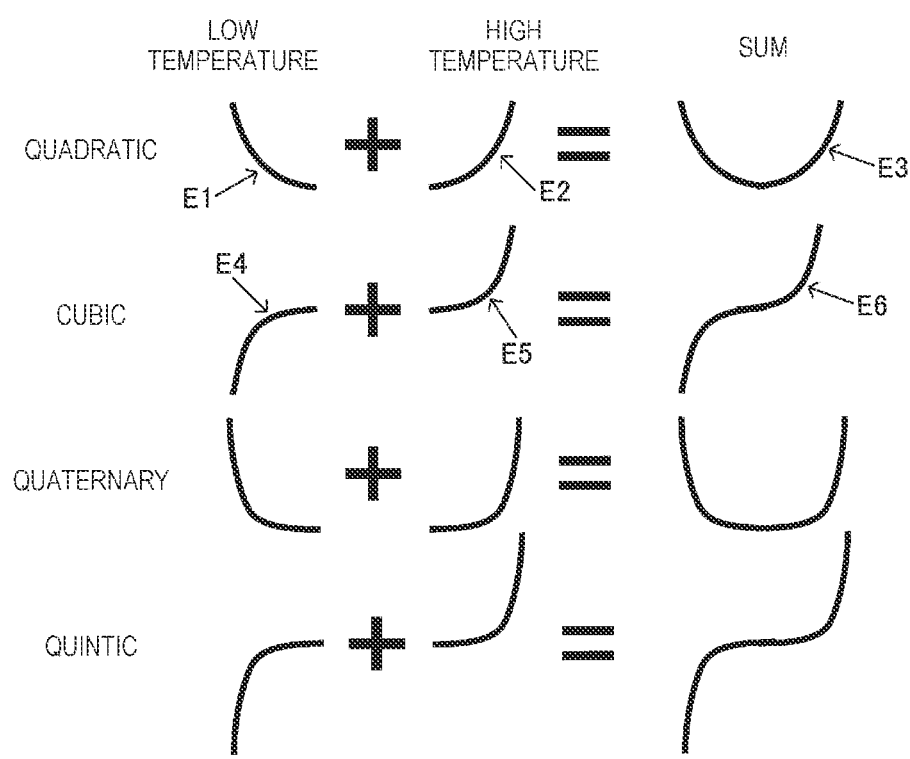
FIG. 10 is an explanatory diagram showing a method for generating a function current.

In the low-temperature range, the current IF=IF1+IF2 increases, whereas the current IG=IG1+IG2 decreases. On the other hand, in the high-temperature range, the current IG=IG1+IG2 increases, whereas the current IF=IF1+IF2 decreases. By using such a function current generation circuit 140, as shown in FIG. 10, a high-order function current such as a quadratic, cubic, quaternary, or quintic function current can be generated. For example, the current IF flowing through the first compensation circuit 151 in the low-temperature range is set to have a characteristic indicated by E1 in FIG. 10, and the current IG flowing through the second compensation circuit 152 in the high-temperature range is set to have a characteristic indicated by E2. Accordingly, a quadratic function current as indicated by E3 can be generated. In addition, the current IF flowing through the first compensation circuit 151 in the low-temperature range is set to have a characteristic indicated by E4 in FIG. 10, and the current IG flowing through the second compensation circuit 152 in the high-temperature range is set to have a characteristic indicated by E5. Accordingly, a cubic function current as indicated by E6 can be generated.

In the embodiment, the temperature compensation circuit 40 may generate, as the second temperature compensation signal SCP2, a temperature compensation signal having a quadratic coefficient characteristic, which is a quadratic function characteristic, different from that of the first temperature compensation signal SCP1 with respect to the temperature. For example, the deviation in the temperature compensation caused by the change in the heat generation state is corrected by adjusting a quadratic coefficient of the function current that generates the temperature compensation signal.

For example, as shown in FIG. 2, when the output circuit 80 is changed from the first state to the second state and the heat generation state is changed, the frequency-temperature characteristic of the resonator 10 is as indicated by A3, whereas the frequency-temperature characteristic for which the temperature compensation is to be performed by the circuit apparatus 20 is as indicated by A4, and thus there is a deviation therebetween. Due to this deviation, as indicated by A5, the frequency-temperature characteristic after the temperature compensation is not flat and has a quadratic function characteristic.

In the embodiment, the temperature compensation circuit 40 generates the second temperature compensation signal SCP2 having a quadratic coefficient characteristic different from that of the first temperature compensation signal SCP1, thereby correcting the quadratic function characteristic indicated by A5 in FIG. 2 into a flat characteristic indicated by A2.

In this way, even when the output circuit 80 is changed from the first state to the second state, the heat generation state is changed, and the deviation in the temperature compensation corresponding to the quadratic coefficient characteristic occurs, the deviation in the temperature compensation can be appropriately corrected by using the second temperature compensation signal SCP2 having the quadratic coefficient characteristic different from that of the first temperature compensation signal SCP1.

For example, the function current generation circuit 140 in FIG. 9 provided in the temperature compensation circuit 40 can generate the quadratic function current as shown in FIG. 10. Therefore, the function current generation circuit 140 of the temperature compensation circuit 40 generates the quadratic function current that cancels the quadratic function characteristic indicated by A5 in FIG. 2, and thus the deviation in the temperature compensation can be appropriately corrected. Specifically, when the output circuit 80 is in the first state, the temperature compensation circuit 40 generates a function current of a polynomial that approximates a frequency-temperature characteristic based on the temperature detection signal STS from the temperature sensor 48 through using a first coefficient as a quadratic coefficient of the polynomial and outputs the first temperature compensation signal SCP1 based on the function current. On the other hand, when the output circuit 80 is in the second state, the temperature compensation circuit 40 generates a function current by using a second coefficient different from the first coefficient as the quadratic coefficient and outputs the second temperature compensation signal SCP2 based on the function current. Such function currents are generated by the function current generation circuit 140 shown in FIG. 9. In this way, the temperature compensation circuit 40 can generate the second temperature compensation signal SCP2 having a quadratic coefficient characteristic different from that of the first temperature compensation signal SCP1.

3. Digital Temperature Compensation

Figure 11:
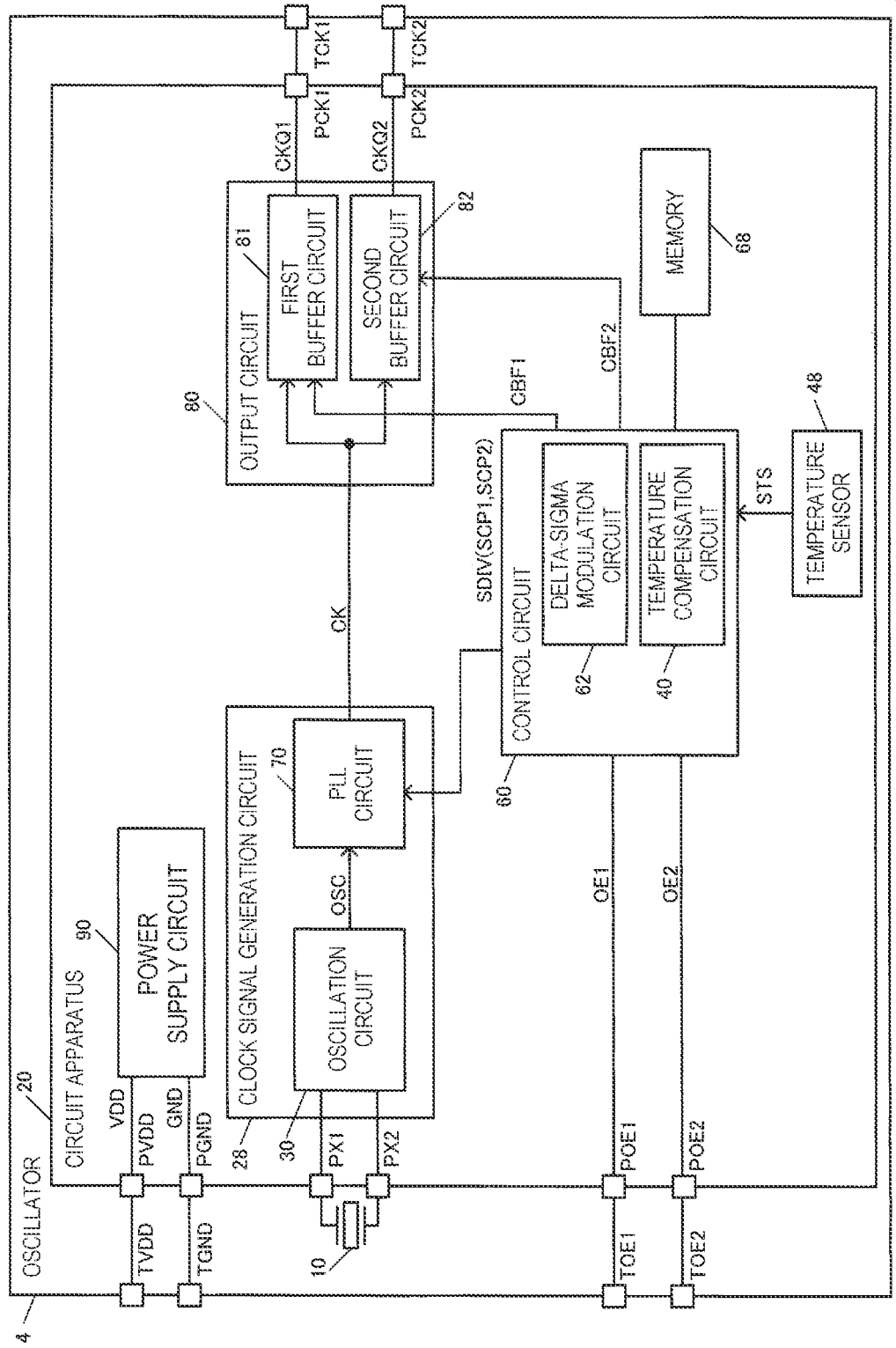
FIG. 11 shows another detailed configuration example of the circuit apparatus and the oscillator according to the embodiment.

FIG. 11 shows another detailed configuration example of the circuit apparatus 20 and the oscillator 4 according to the embodiment. In FIG. 11, the temperature compensation circuit 40 implements the temperature compensation for the clock frequency by performing digital temperature compensation. In FIG. 11, the clock signal generation circuit 28 includes the oscillation circuit 30 and a PLL circuit 70. The control circuit 60 includes the temperature compensation circuit 40 and a delta-sigma modulation circuit 62. In addition, a memory 68 that stores coefficient information on temperature compensation and the like is provided in the circuit apparatus 20. The memory 68 may be implemented by, for example, a nonvolatile memory. In FIG. 11, detailed description of the same configuration as in FIG. 3 is omitted.

In this way, in FIG. 11, the clock signal generation circuit 28 includes the oscillation circuit 30 that generates an oscillation signal OSC by oscillating the resonator 10, and the PLL circuit 70 that generates the clock signal CK based on the oscillation signal OSC. For example, the PLL circuit 70 generates the clock signal CK having a frequency obtained by multiplying a frequency of the oscillation signal OSC. The temperature compensation circuit 40 is a temperature compensation circuit that performs digital temperature compensation and outputs a frequency divider ratio setting signal SDIV of the PLL circuit 70 as the first temperature compensation signal SCP1 and the second temperature compensation signal SCP2. For example, when the output circuit 80 operates in the first state, the temperature compensation circuit 40 outputs a first frequency divider ratio setting signal SDIV1 that compensates for the frequency-temperature characteristic when the output circuit 80 operates in the first state. On the other hand, when the output circuit 80 operates in the second state, the temperature compensation circuit 40 outputs a second frequency divider ratio setting signal SDIV2 that compensates for the frequency-temperature characteristic when the output circuit 80 operates in the second state and that is different from the first frequency divider ratio setting signal SDIV1. The first frequency divider ratio setting signal SDIV1 and the second frequency divider ratio setting signal SDIV2 have different frequency divider ratio setting characteristics with respect to the temperature.

In this way, the temperature compensation circuit 40 outputs the frequency divider ratio setting signal SDIV as the first temperature compensation signal SCP1 and the second temperature compensation signal SCP2 to the PLL circuit 70 that generates the clock signal CK having the frequency obtained by multiplying the frequency of the oscillation signal OSC, and controls a frequency divider ratio of a frequency divider circuit, thereby enabling digital temperature compensation. Accordingly, the temperature-compensated clock signal CK can be generated. When the output circuit 80 is in the first state, the first frequency divider ratio setting signal SDIV1 is output to the PLL circuit 70 as the first temperature compensation signal SCP1. When the output circuit 80 is in the second state, the second frequency divider ratio setting signal SDIV2 is output to the PLL circuit 70 as the second temperature compensation signal SCP2. In this way, even when the output circuit 80 is changed from the first state to the second state and the heat generation state is changed, appropriate temperature compensation for the oscillation signal can be performed, and the appropriately temperature-compensated output clock signal can be output.

Figure 12:
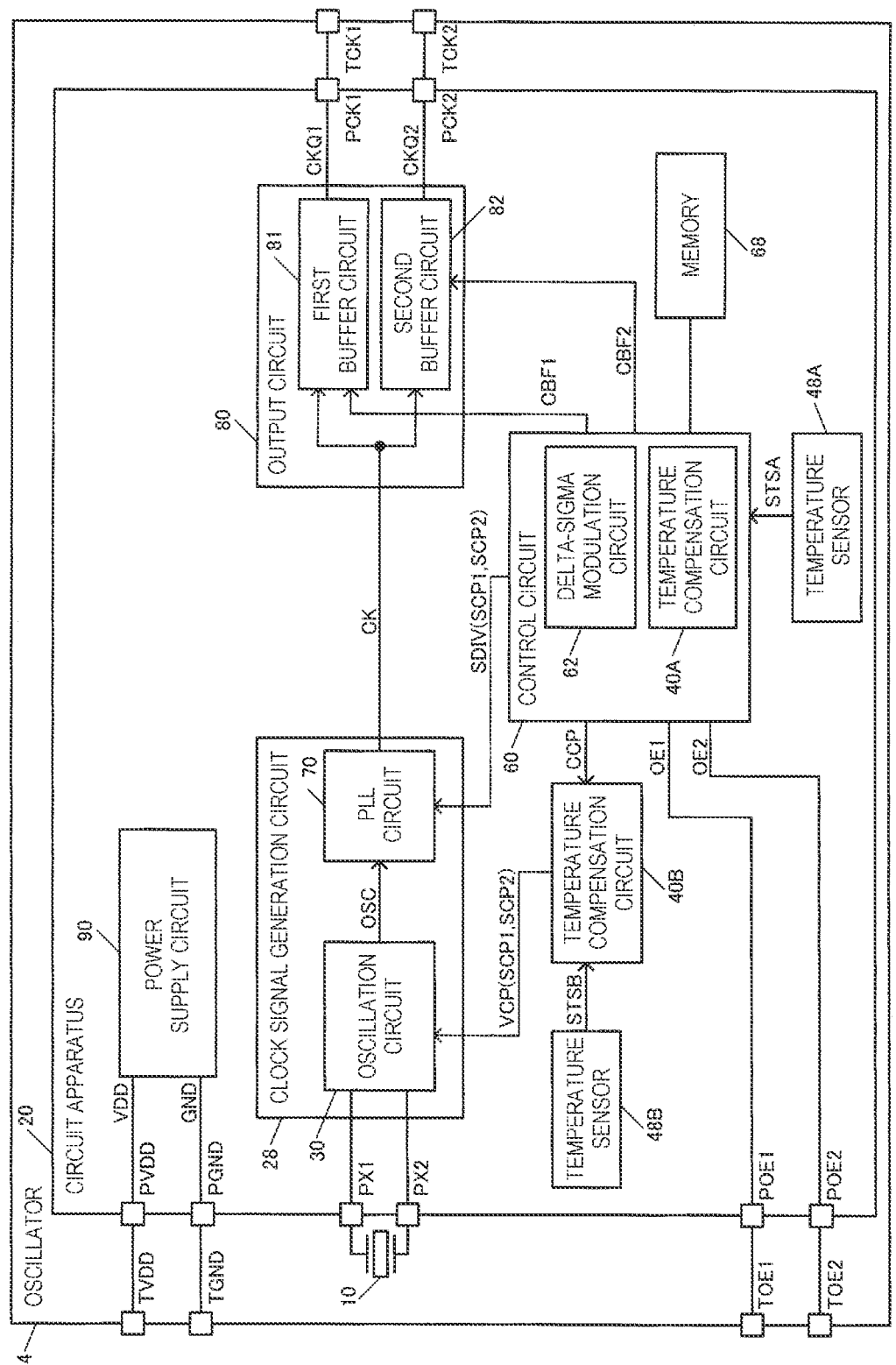
FIG. 12 shows another detailed configuration example of the circuit apparatus and the oscillator according to the embodiment.

FIG. 12 shows another detailed configuration example of the circuit apparatus 20 and the oscillator 4 according to the embodiment. In FIG. 12, a temperature compensation circuit 40A performs digital temperature compensation whereas a temperature compensation circuit 40B performs analog temperature compensation, thereby implementing temperature compensation for the clock frequency. For example, the temperature compensation circuit 40A of the control circuit 60 performs digital temperature compensation based on a temperature detection signal STSA from a temperature sensor 48A. For example, by inputting the frequency divider ratio setting signal SDIV as the first temperature compensation signal SCP1 and the second temperature compensation signal SCP2 to the PLL circuit 70, the digital temperature compensation is implemented. In addition, the temperature compensation circuit 40B performs analog temperature compensation based on a temperature detection signal STSB from a temperature sensor 48B. For example, the analog temperature compensation is implemented by inputting the temperature compensation voltage VCP as the first temperature compensation signal SCP1 and the second temperature compensation signal SCP2 to the oscillation circuit 30. More specifically, first temperature compensation in an analog manner is performed by the temperature compensation circuit 40B, and second temperature compensation in a digital manner is performed by the temperature compensation circuit 40A as temperature compensation that removes a remaining frequency deviation component left by the first temperature compensation in an analog manner.

A common temperature sensor may be used as the temperature sensors 48A and 48B. In addition, the circuit apparatus 20 may be implemented by a first semiconductor chip in which the temperature compensation circuit 40B, the oscillation circuit 30, and the like are provided, and a second semiconductor chip in which the temperature compensation circuit 40A, the delta-sigma modulation circuit 62, the PLL circuit 70, and the like are provided.

Figure 13:
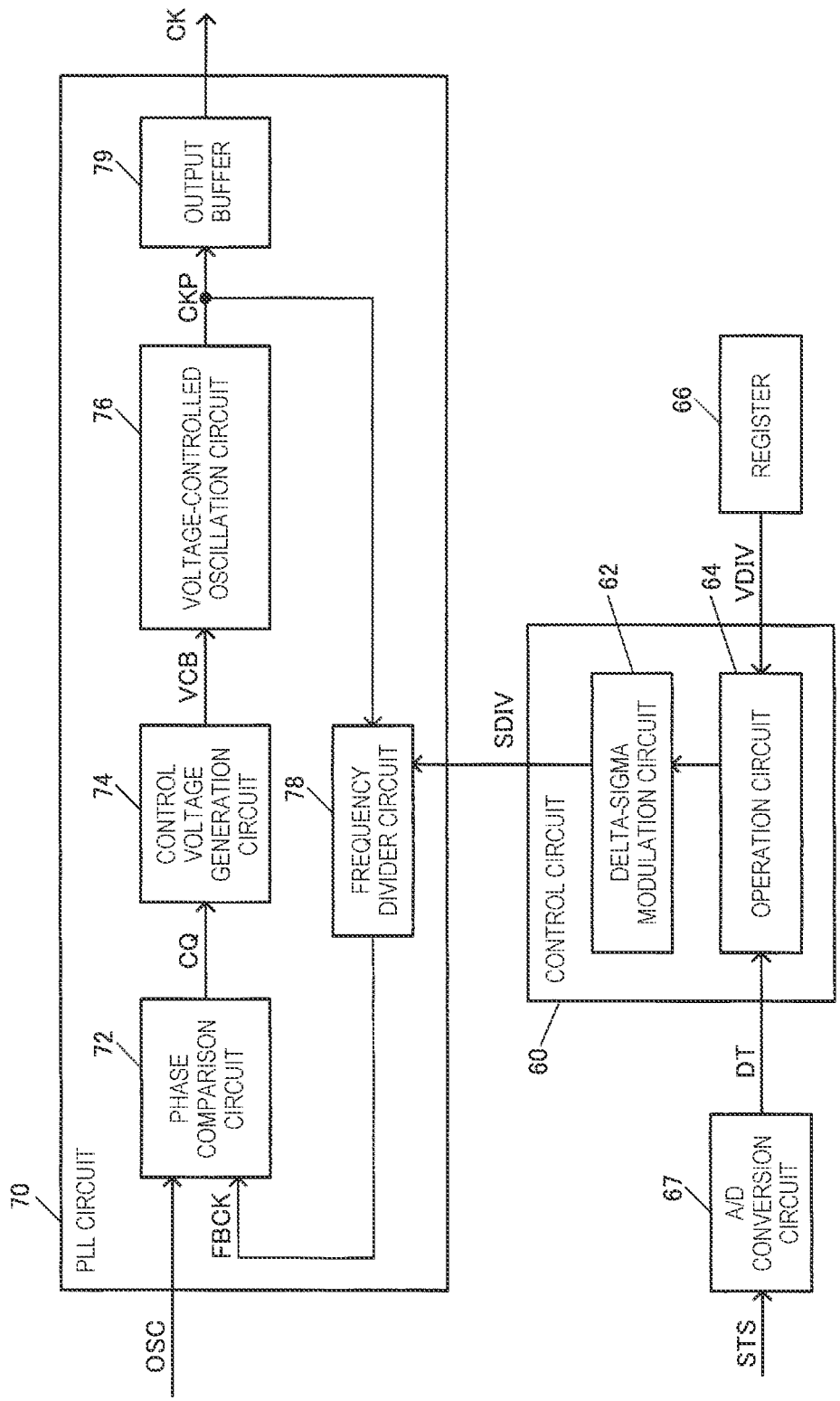
FIG. 13 shows a configuration example of a PLL circuit.

FIG. 13 shows a detailed configuration example of the PLL circuit 70, the control circuit 60, and the like. The PLL circuit 70 receives the oscillation signal OSC as a reference clock signal and performs a phase locked loop (PLL) operation. For example, the PLL circuit 70 generates the clock signal CK having a frequency obtained by multiplying the frequency of the oscillation signal OSC which is an oscillation clock signal and generates a high-precision clock signal CK synchronized in phase with the oscillation signal OSC. The PLL circuit 70 includes a phase comparison circuit 72, a control voltage generation circuit 74, a voltage-controlled oscillation circuit 76, a frequency divider circuit 78, and an output buffer 79.

The phase comparison circuit 72 performs phase comparison between the oscillation signal OSC as the reference clock signal and a feedback clock signal FBCK. For example, the phase comparison circuit 72 compares phases of the oscillation signal OSC and the feedback clock signal FBCK, and outputs a signal CQ corresponding to a phase difference between the oscillation signal OSC and the feedback clock signal FBCK as a phase comparison result signal.

The signal CQ corresponding to the phase difference is, for example, a pulse signal having a pulse width proportional to the phase difference.

The control voltage generation circuit 74 generates a control voltage VCB based on the result of the phase comparison by the phase comparison circuit 72. For example, the control voltage generation circuit 74 performs a charge pump operation or filter process based on the phase comparison result signal CQ from the phase comparison circuit 72 to generate the control voltage VCB for controlling oscillation of the voltage-controlled oscillation circuit 76.

The voltage-controlled oscillation circuit 76 which is a voltage-controlled oscillator (VCO) generates a clock signal CKP having a frequency corresponding to the control voltage VCB. For example, an oscillation operation is performed based on the control voltage VCB from the control voltage generation circuit 74 to generate the clock signal CKP. For example, the voltage-controlled oscillation circuit 76 generates, by the oscillation operation, the clock signal CKP having a frequency that changes according to the control voltage VCB. As the voltage-controlled oscillation circuit 76, for example, an LC oscillation circuit using an inductor can be used. The output buffer 79 outputs a signal obtained by buffering the clock signal CKP as the clock signal CK.

The frequency divider circuit 78 divides a frequency of the clock signal CKP and outputs the feedback clock signal FBCK. For example, the frequency divider circuit 78 outputs, as the feedback clock signal FBCK, a signal having a frequency obtained by dividing the frequency of the clock signal CKP by a frequency divider ratio set based on the frequency divider ratio setting signal SDIV. For example, when an oscillation frequency of the voltage-controlled oscillation circuit 76 is fvco and a frequency divider ratio of a frequency division operation of the frequency divider circuit 78 is DIV, a frequency of the feedback clock signal FBCK is fvco/DIV. As described above, the phase comparison circuit 72 performs the phase comparison between the oscillation signal OSC and the feedback clock signal FBCK from the frequency divider circuit 78.

The control circuit 60 includes the delta-sigma modulation circuit 62 and an operation circuit 64. When the delta-sigma modulation circuit 62 performs delta-sigma modulation, the PLL circuit 70 operates as a fractional-N PLL circuit. In addition, the operation circuit 64 performs a temperature compensation process based on temperature detection data DT obtained by subjecting the temperature detection signal STS to A/D conversion by an A/D conversion circuit 67 and a frequency divider ratio setting value VDIV from a register 66. The operation circuit 64 corresponds to the temperature compensation circuit 40 in FIG. 11 and the temperature compensation circuit 40A in FIG. 12. The frequency divider ratio setting value VDIV is data for setting a frequency divider ratio of the PLL circuit 70. The delta-sigma modulation circuit 62 performs delta-sigma modulation on an operation value that is an operation result of the operation circuit 64 and outputs the frequency divider ratio setting signal SDIV for setting the frequency divider ratio of the frequency divider circuit 78.

For example, in FIG. 13, the frequency divider circuit 78 and the delta-sigma modulation circuit 62 constitute a fractional frequency divider. The fractional frequency divider divides a frequency of the clock signal CKP by using a reciprocal of a multiplication ratio of the PLL circuit 70 as a frequency divider ratio and outputs the frequency-divided clock signal as the feedback clock signal FBCK to the phase comparison circuit 72. The delta-sigma modulation circuit 62 performs delta-sigma modulation on a value of a fractional part of the frequency divider ratio to generate a modulation value that is an integer. For example, the delta-sigma modulation circuit 62 performs a cubic or quaternary delta-sigma modulation process. A sum of a value of an integer part of the frequency divider ratio and the modulation value is set as the frequency divider ratio setting signal SDIV in the frequency divider circuit 78. Accordingly, the fractional-N PLL circuit 70 is implemented.

In FIG. 13, frequency divider ratio setting information at each temperature is stored in the register 66. For example, the frequency divider ratio setting information is stored in the memory in FIG. 11, and the frequency divider ratio setting information is transferred to and retained in the register 66. For example, the frequency divider ratio setting information may be implemented by a look-up table in which each temperature is input and the frequency divider ratio setting value VDIV at each temperature is output. The operation circuit 64 acquires a frequency divider ratio at each temperature based on the temperature detection data DT from the A/D conversion circuit 67 and the frequency divider ratio setting information in the register 66 and accordingly outputs the frequency divider ratio setting signal SDIV to the frequency divider circuit 78 of the PLL circuit 70.

In the embodiment, when the output circuit 80 is in the first state, first frequency divider ratio setting information corresponding to the first state is read from the register 66, and the frequency divider ratio setting signal SDIV is generated based on the first frequency divider ratio setting information and the temperature detection data DT. On the other hand, when the output circuit 80 is in the second state, second frequency divider ratio setting information corresponding to the second state is read from the register 66, and the frequency divider ratio setting signal SDIV is generated based on the second frequency divider ratio setting information and the temperature detection data DT. The first frequency divider ratio setting information is, for example, a first look-up table, and the second frequency divider ratio setting information is, for example, a second look-up table. In this way, appropriate digital temperature compensation according to the heat generation state of each state of the output circuit 80 can be implemented.

Alternatively, when the output circuit 80 is changed from the first state to the second state, digital temperature compensation according to the heat generation state of each state of the output circuit 80 may be implemented by shifting the temperature detection data DT. Accordingly, in the same manner as the method shown in FIG. 4, the digital temperature compensation can be implemented by shifting a characteristic of frequency divider ratio setting in the temperature direction.

Various processes are conceivable as the digital temperature compensation. For example, a digital temperature compensation process may be performed based on information on a trained model. For example, the control circuit 60 may perform the digital temperature compensation process based on the temperature detection data DT and the information on the trained model stored in the memory 68.

Figure 14:
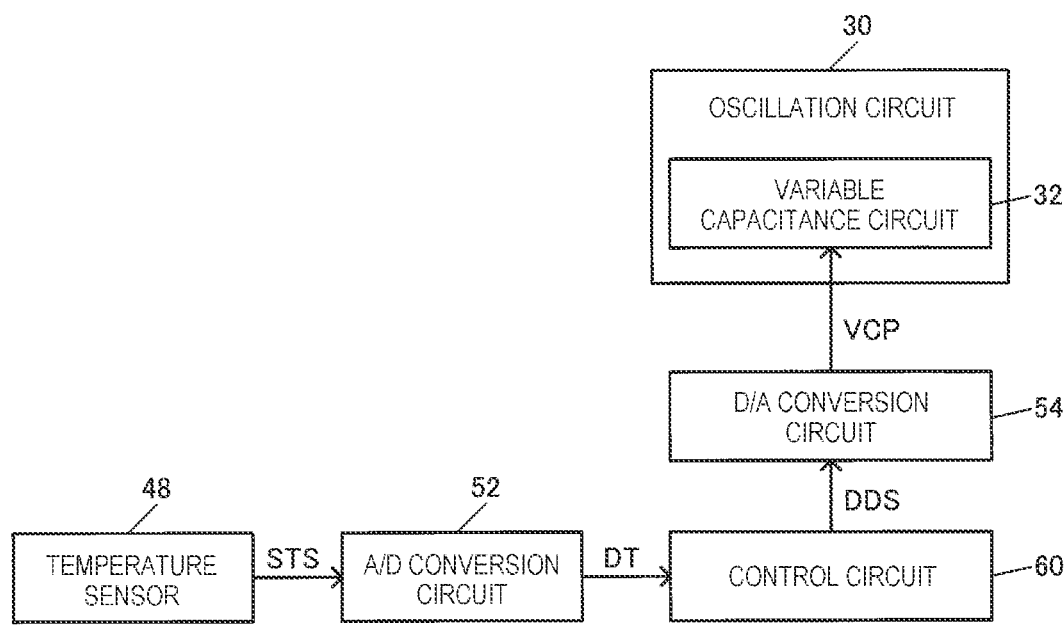
FIG. 14 is an explanatory diagram showing an example of temperature compensation for an oscillation frequency based on a temperature detection signal.
Figure 15:
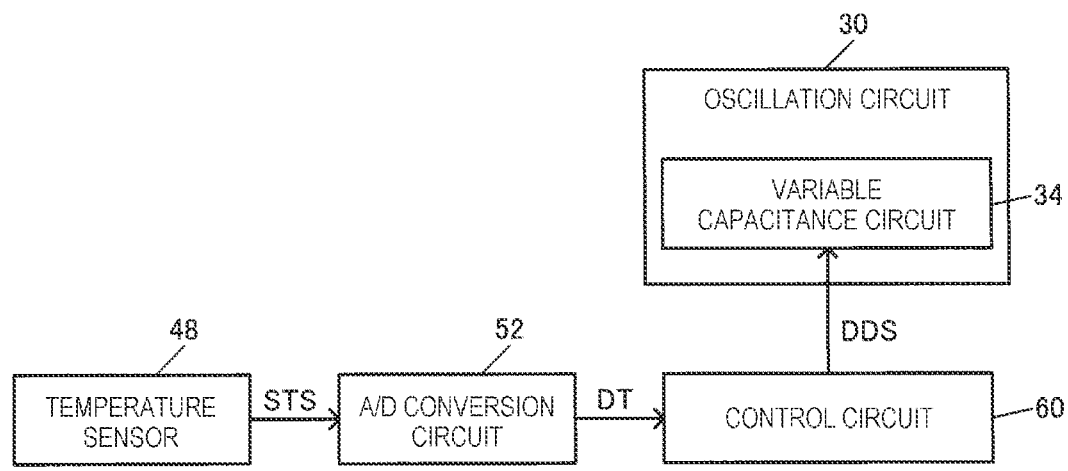
FIG. 15 is an explanatory diagram showing an example of the temperature compensation for the oscillation frequency based on the temperature detection signal.

Various modifications can be implemented as the temperature compensation for the oscillation circuit 30. For example, in FIG. 14, the temperature detection data DT obtained by subjecting the temperature detection signal STS of the temperature sensor 48 to A/D conversion by the A/D conversion circuit 52 is input to the control circuit 60. The control circuit 60 generates temperature compensation data DDS based on the temperature detection data DT, and a D/A conversion circuit 54 performs D/A conversion on the temperature compensation data DDS to output the temperature compensation voltage VCP to a variable capacitance circuit 32 of the oscillation circuit 30. The variable capacitance circuit 32 is implemented by a variable capacitance element such as a varactor, and a capacitance of the variable capacitance element is controlled by the temperature compensation voltage VCP, thereby implementing temperature compensation for the oscillation frequency of the oscillation circuit 30. On the other hand, in FIG. 15, the control circuit 60 generates the temperature compensation data DDS based on the temperature detection data DT and outputs the temperature compensation data DDS to the variable capacitance circuit 34 of the oscillation circuit 30. The variable capacitance circuit 34 includes a capacitor array and a switch array coupled to the capacitor array. When a plurality of switches in the switch array are turned on or off based on the digital temperature compensation data DDS, the capacitance of the variable capacitance circuit 34 is controlled, and the temperature compensation for the oscillation frequency of the oscillation circuit 30 is implemented.

4. Modifications

Figure 16:
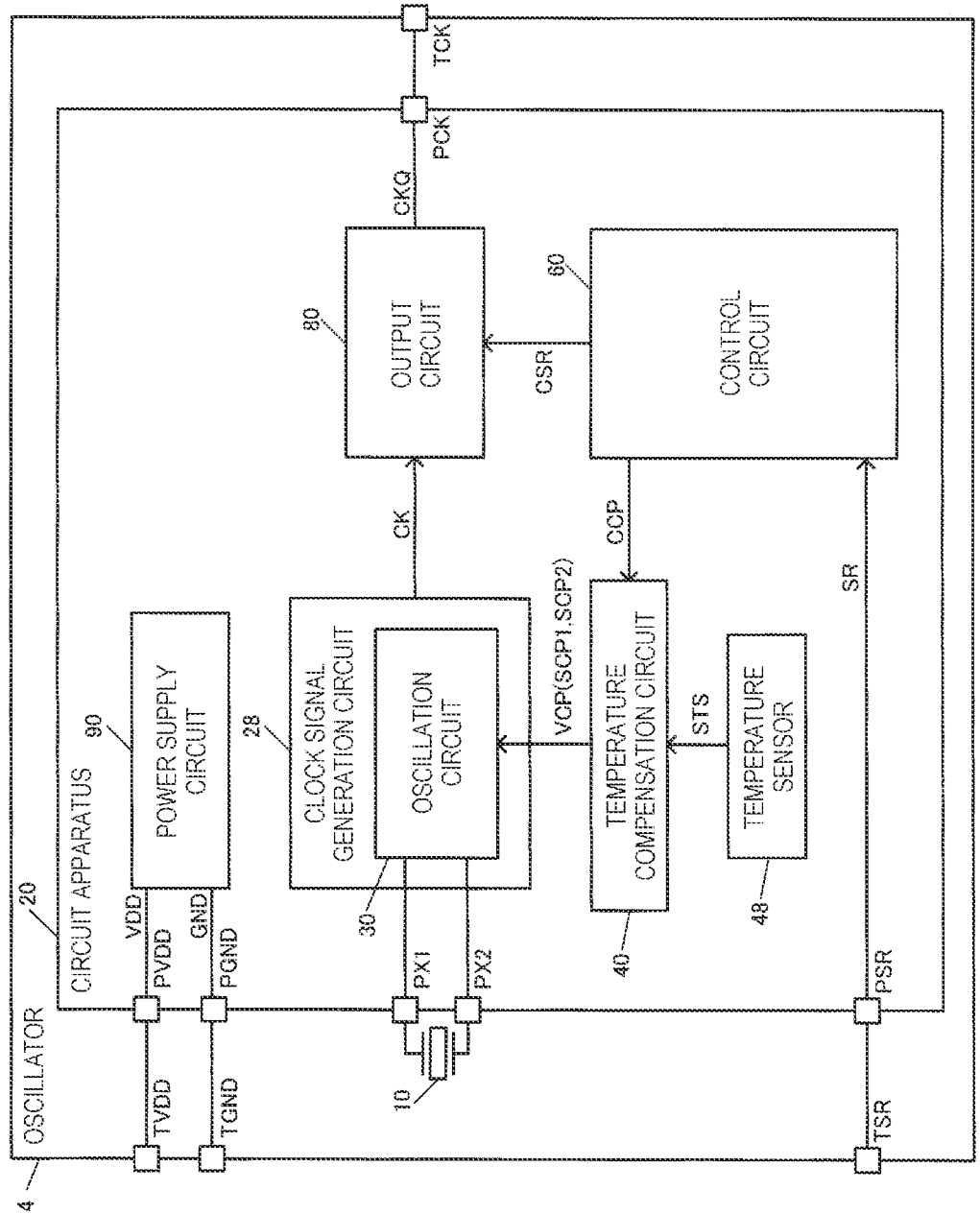
FIG. 16 shows a first modification of the circuit apparatus and the oscillator according to the embodiment.

Next, various modifications of the embodiment will be described. FIG. 16 shows a first modification of the circuit apparatus 20 and the oscillator 4 according to the embodiment. In FIG. 16, temperature compensation is switched according to control of switching a slew rate of the output clock signal CKQ of the output circuit 80. In this way, each state such as the first state and the second state of the output circuit 80 may be a setting state of the slew rate of the output clock signal CKQ of the output circuit 80.

For example, in FIG. 16, the control circuit 60 receives a control signal SR of the slew rate of the output clock signal CKQ as at least one external control signal. For example, the control signal SR is input to the control circuit 60 via a terminal TSR of the oscillator 4 and a pad PSR of the circuit apparatus 20. The slew rate control signal SR is generated by, for example, a processing apparatus of an external processing system. The control circuit 60 controls the slew rate of the output circuit 80 based on a control signal CSR corresponding to the control signal SR. The output circuit 80 outputs the output clock signal CKQ at a first slew rate in the first state and outputs the output clock signal CKQ at a second slew rate in the second state. The second slew rate is a slew rate different from the first slew rate and is, for example, a slew rate higher than the first slew rate. In addition, the slew rate corresponds to a rising or falling slope of the output clock signal CKQ and is defined by rising or falling time of the output clock signal CKQ. For example, when the slew rate of the output clock signal CKQ is set to be a low slew rate, the consumption current of the output circuit 80 is small and the amount of generated heat is small. When the slew rate of the output clock signal CKQ is set to be a fast slew rate, the consumption current of the output circuit 80 is increased and the amount of generated heat is increased. Therefore, in the embodiment, compensation is performed for a deviation in temperature compensation caused by the change in the amount of generated heat accompanying the switching of the slew rate of the output clock signal CKQ. For example, when the output circuit 80 is in the first state in which the output clock signal CKQ at the first slew rate is output, the temperature compensation circuit 40 outputs the first temperature compensation signal SCP1 corresponding to the first state at the first slew rate, and temperature compensation is performed based on the first temperature compensation signal SCP1. In addition, when the output circuit 80 is in the second state in which the output clock signal CKQ at the second slew rate is output, the temperature compensation circuit 40 outputs the second temperature compensation signal SCP2 corresponding to the second state at the second slew rate, and temperature compensation is performed based on the second temperature compensation signal SCP2. The output circuit 80 may operate in a plurality of states corresponding to three or more slew rates, such as a third state in which the output clock signal CKQ at a third slew rate is output.

In this way, when the slew rate is switched from the first slew rate to the second slew rate and the heat generation state of the output circuit 80 is changed, appropriate temperature compensation according to the heat generation state can be implemented. For example, when the second slew rate is a slew rate higher than the first slew rate and the amount of generated heat is large, the second temperature compensation signal SCP2 obtained by shifting the first temperature compensation signal SCP1 in the temperature direction is generated, so that appropriate temperature compensation according to the heat generation state corresponding to the slew rate can be implemented.

Figure 17:
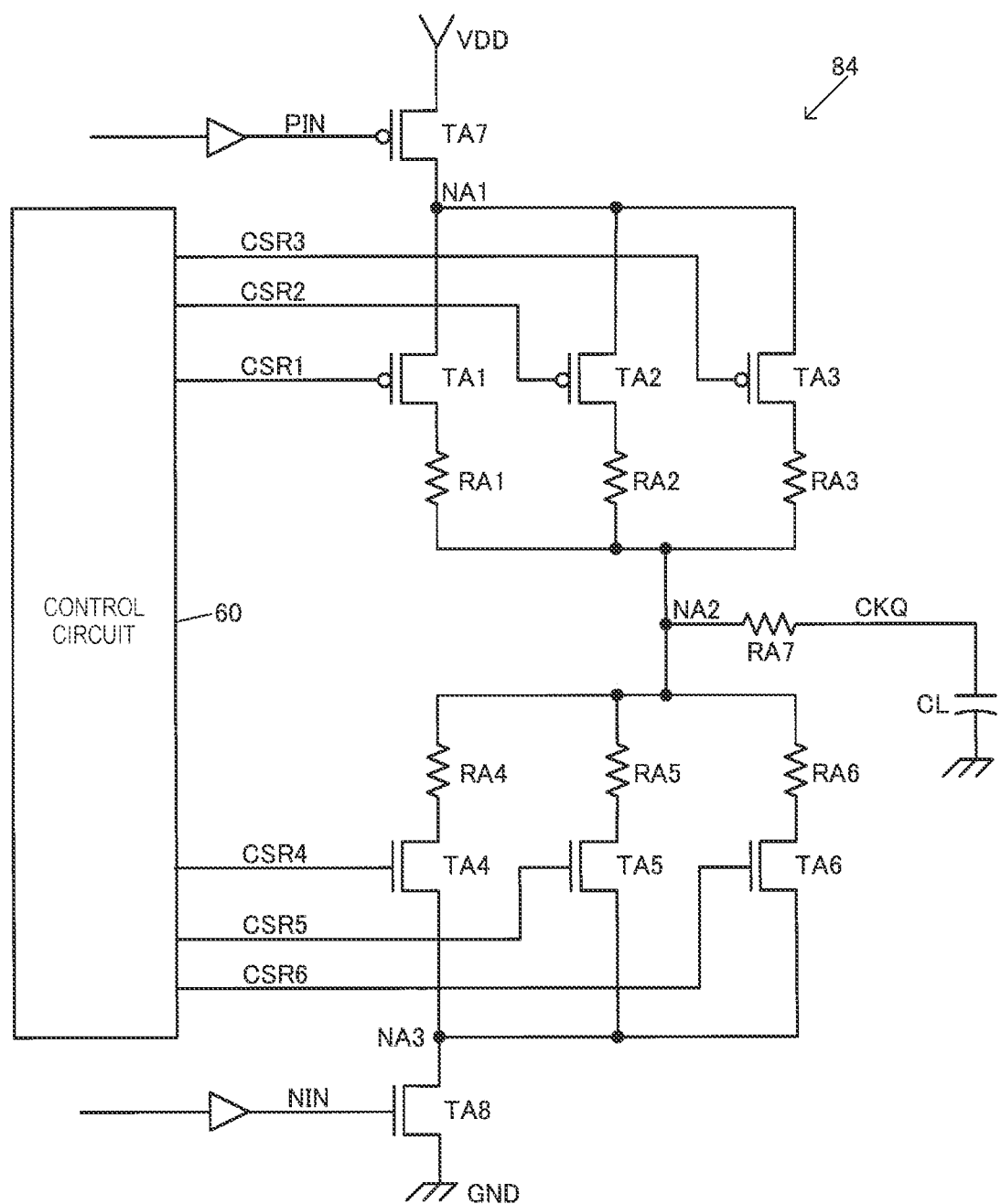
FIG. 17 shows a configuration example of a slew rate control circuit of an output circuit.

FIG. 17 shows a configuration example of a slew rate control circuit 84 provided in the output circuit 80. The slew rate control circuit 84 is provided, for example, in a buffer circuit of the output circuit 80. The slew rate control circuit 84 includes transistors TA1 to TA8 and resistors RA1 to RA7. The transistors TA1, TA2, TA3, and TA7 are, for example, P-type transistors, and the transistors TA4, TA5, TA6, and TA8 are, for example, N-type transistors. The transistor TA7 is provided between the VDD node and a node NA1 and is turned on or off based on a signal PIN. The transistors TA1, TA2, and TA3 and the resistors RA1, RA2, and RA3 are provided such that each transistor and each resistor are coupled in series between the node NA1 and a node NA2. Slew rate control signals CSR1, CSR2, and CSR3 are input to gates of the transistors TA1, TA2, and TA3.

The transistor TA8 is provided between the GND node and a node NA3 and is turned on or off based on a signal NIN. The transistors TA4, TA5, and TA6 and the resistors RA4, RA5, and RA6 are provided such that each transistor and each resistor are coupled in series between the node NA3 and the node NA2. Slew rate control signals CSR4, CSR5, and CSR6 are input to gates of the transistors TA4, TA5, and TA6. In addition, the node NA2 is coupled to an external load CL via the resistor RA7.

According to the slew rate control circuit 84 in FIG. 17, a rising slew rate of the output clock signal CKQ can be controlled by setting on and off of the transistors TA1, TA2, and TA3 by the slew rate control signals CSR1, CSR2, and CSR3 from the control circuit 60. That is, by setting on and off of the transistors TA1, TA2, and TA3, which constitute a P-side output transistor, by the control signals CSR1, CSR2, and CSR3, it is possible to control a drive capability of the P-side output transistor and control the rising slew rate. In addition, a falling slew rate of the output clock signal CKQ can be controlled by setting on and off of the transistors TA4, TA5, and TA6 based on the slew rate control signals CSR4, CSR5, and CSR6 from the control circuit 60. That is, by setting on and off of the transistors TA4, TA5, and TA6, which constitute an N-side output transistor, by the control signals CSR4, CSR5, and CSR6, it is possible to control a drive capability of the N-side output transistor and control the falling slew rate.

When the drive capability of each output transistor is changed due to such setting of the slew rate, the heat generation state of the output circuit 80 is also changed due to a change in a through current that directly flows from the VDD that is the high potential side power supply to the GND that is the low potential side power supply, and thus there is a deviation in temperature compensation.

In this regard, in the embodiment, in the first state in which the output transistor of the output circuit 80 is set to the first slew rate, temperature compensation is performed based on the first temperature compensation signal SCP1 corresponding to the first state at the first slew rate. In addition, in the second state in which the output transistor of the output circuit 80 is set to the second slew rate, temperature compensation is performed based on the second temperature compensation signal SCP2 corresponding to the second state at the second slew rate. Therefore, even when the heat generation state is changed due to the setting of the slew rate of the output circuit 80, the clock frequency can be appropriately temperature-compensated.

Figure 18:
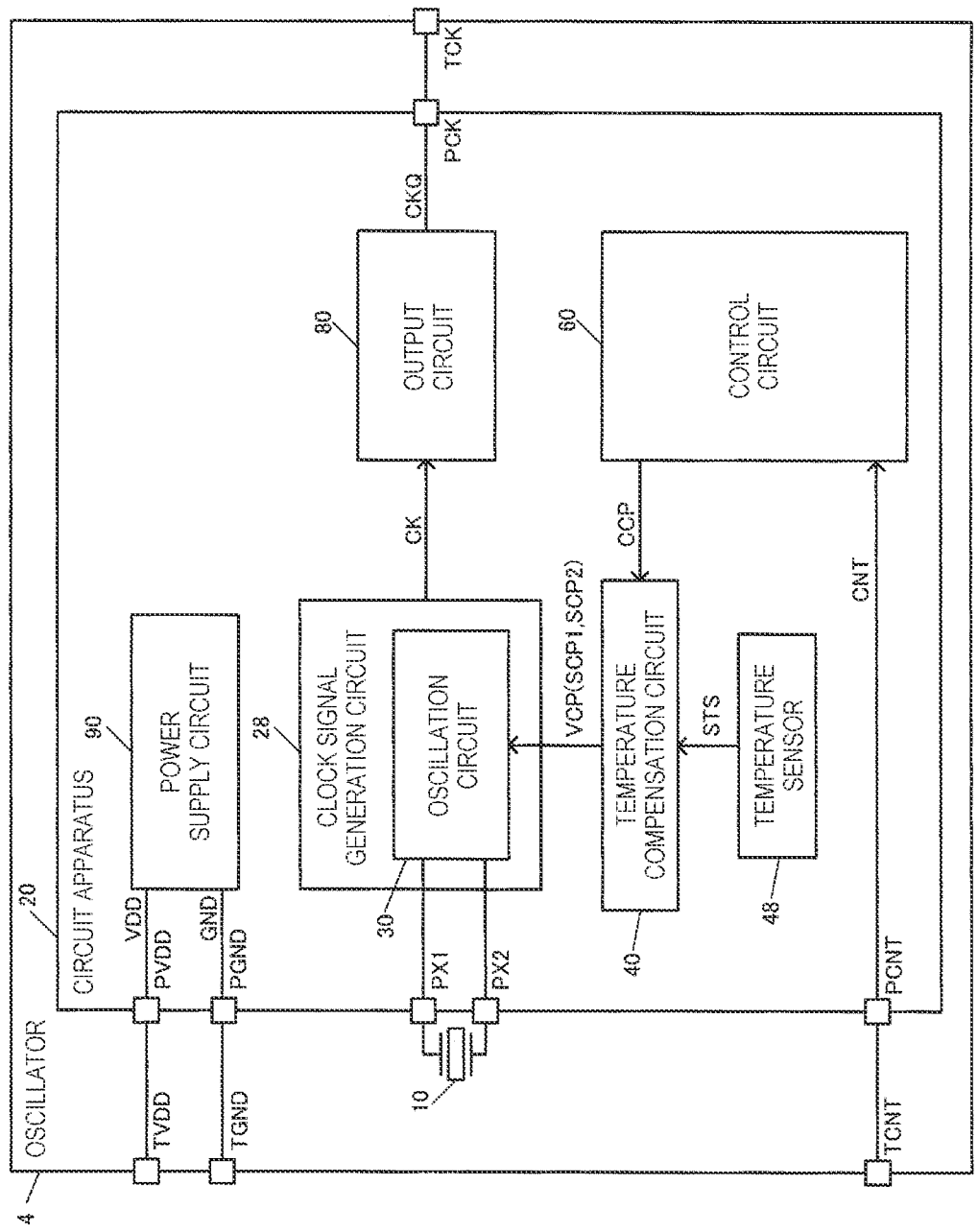
FIG. 18 shows a second modification of the circuit apparatus and the oscillator according to the embodiment.

FIG. 18 shows a second modification of the circuit apparatus 20 and the oscillator 4 according to the embodiment. In FIG. 18, an external control signal CNT is input to the control circuit 60. Specifically, the external control signal CNT from a processing apparatus or the like of an external processing system is input to the control circuit 60 via a terminal TCNT of the oscillator 4 and a pad PCNT of the circuit apparatus 20. The control circuit 60 directly switches the temperature compensation according to the external control signal CNT. For example, in response to the external control signal CNT, the temperature compensation circuit 40 generates the first temperature compensation signal SCP1 and performs temperature compensation based on the first temperature compensation signal SCP1, or the temperature compensation circuit 40 generates the second temperature compensation signal SCP2 and performs temperature compensation based on the second temperature compensation signal SCP2. For example, the external processing apparatus changes a voltage level of the external control signal CNT according to a change in a load of the output clock signal CKQ at a terminal TCK. For example, the processing apparatus sets the external control signal CNT to the first voltage level when the load of the terminal TCK of the output clock signal CKQ is small and sets the external control signal CNT to the second voltage level when the load of the terminal TCK is large. When the load of the terminal TCK of the output clock signal CKQ is changed, the state of the output circuit 80 is also changed to, for example, the first state or the second state. The control circuit 60 switches the temperature compensation for the temperature compensation circuit 40 by using the control signal CCP according to the change in the voltage level of the external control signal CNT. For example, when the external control signal CNT is at the first voltage level, temperature compensation is performed based on the first temperature compensation signal SCP1, and when the external control signal CNT is at the second voltage level, temperature compensation is performed based on the second temperature compensation signal SCP2. In this way, direct switching control of the temperature compensation according to the external control signal CNT can be implemented. For example, it is possible to correct the deviation in the temperature compensation according to a change in the amount of generated heat caused by an external change such as the change in the load of the terminal TCK of the output clock signal CKQ.

In FIG. 18, an analog external control voltage may be input to the circuit apparatus 20 as the external control signal CNT, and external control data obtained by subjecting the analog external control voltage to A/D conversion by an A/D conversion circuit (not shown) may be input to the control circuit 60. The control circuit 60 switches the temperature compensation of the temperature compensation circuit 40 based on the external control data. In this way, switching control of the temperature compensation according to the external control voltage can be implemented. For example, by changing the external control voltage according to a change in the amount of generated heat caused by a change in an external load, various changes in the amount of generated heat can be dealt with.

5. Oscillator

Figure 19:
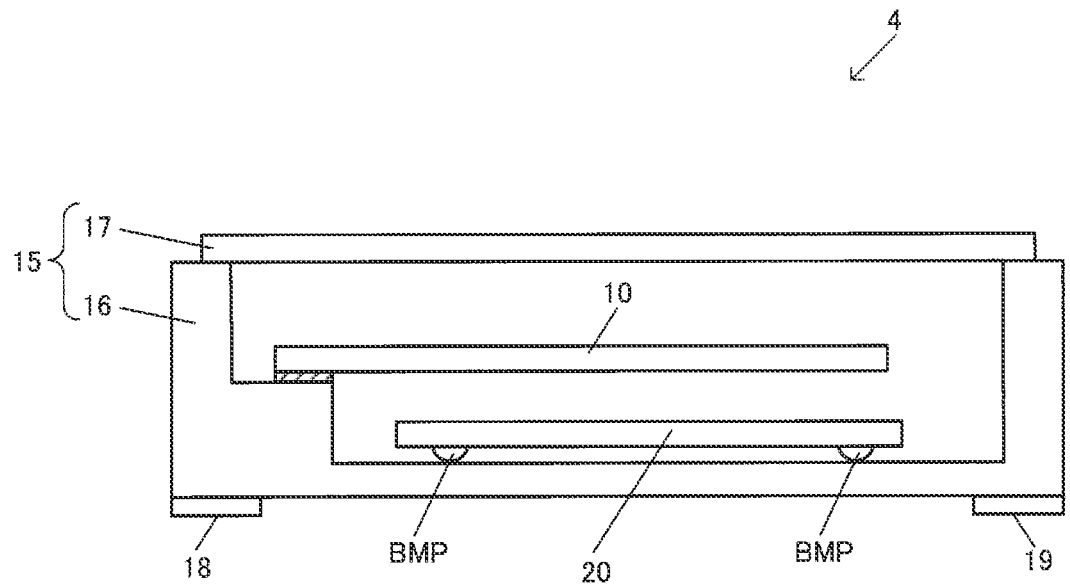
FIG. 19 shows a structural example of an oscillator of a single-seal package.

FIG. 19 shows a first structural example of the oscillator 4 according to the embodiment. FIG. 19 shows the structural example of the oscillator 4 of a single seal package. The oscillator 4 includes the resonator 10, the circuit apparatus 20, and a package 15 that accommodates the resonator 10 and the circuit apparatus 20. The package is formed of, for example, ceramic, and has an accommodation space therein. The resonator 10 and the circuit apparatus 20 are accommodated in the accommodation space. The accommodation space is hermetically sealed and is preferably in a depressurized state close to a vacuum. The package 15 can preferably protect the resonator 10 and the circuit apparatus 20 from impact, dust, heat, humidity, and the like.

The package 15 includes a base 16 and a lid 17. Specifically, the package 15 includes the base 16 that supports the resonator 10 and the circuit apparatus 20, and the lid 17 bonded to an upper surface of the base 16 such that the accommodation space is formed between the lid 17 and the base 16. The resonator 10 is supported, via a terminal electrode, by a step portion provided inside the base 16.

In addition, the circuit apparatus 20 is disposed on an inner bottom surface of the base 16. Specifically, the circuit apparatus 20 is disposed such that an active surface thereof faces the inner bottom surface of the base 16. The active surface is a surface on which a circuit element of the circuit apparatus 20 is formed. In addition, a bump BMP is formed on a terminal of the circuit apparatus 20. The circuit apparatus 20 is supported on the inner bottom surface of the base 16 via the conductive bump BMP. The conductive bump BMP is, for example, a metal bump, and the resonator 10 and the circuit apparatus 20 are electrically coupled via the bump BMP, an internal wiring of the package 15, the terminal electrode, and the like. In addition, the circuit apparatus 20 is electrically coupled to external terminals 18 and 19 of the oscillator 4 via the bump BMP and the internal wiring of the package 15. The external terminals 18 and 19 are formed on an outer bottom surface of the package 15. The external terminals 18 and 19 are coupled to an external device via an external wiring. The external wiring is, for example, a wiring formed on a circuit board on which the external device is mounted. Accordingly, a clock signal or the like can be output to the external device.

In FIG. 19, the circuit apparatus 20 is flip-mounted such that the active surface of the circuit apparatus 20 faces downward, and the embodiment is not limited to such mounting. For example, the circuit apparatus 20 may be mounted such that the active surface of the circuit apparatus 20 faces upward. That is, the circuit apparatus 20 is mounted such that the active surface faces the resonator 10.

Figure 20:
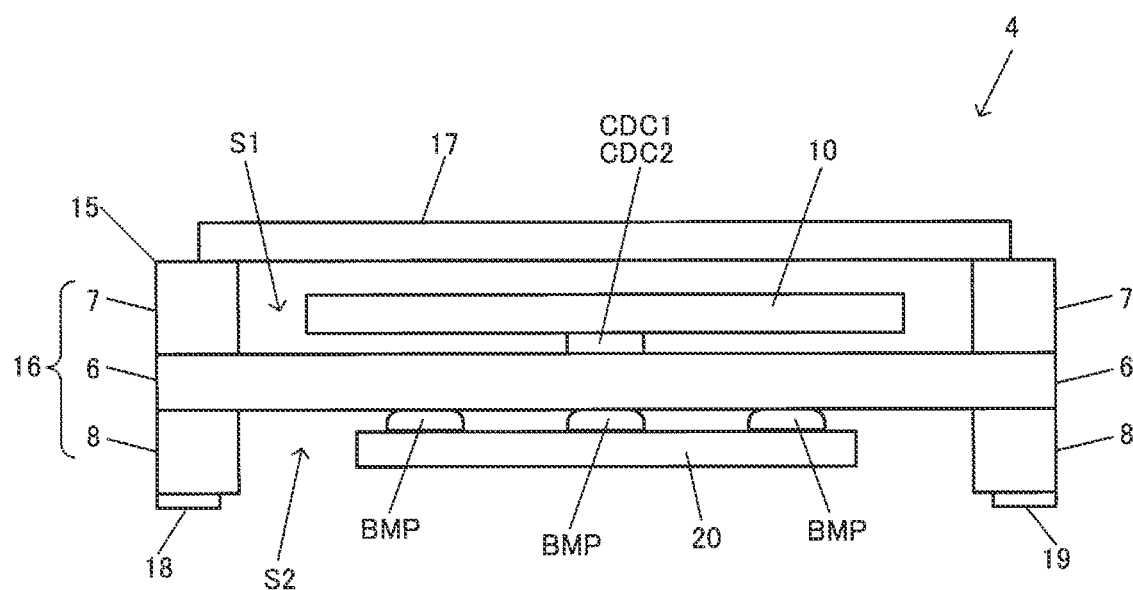
FIG. 20 shows a structural example of an oscillator of an H-type package.

FIG. 20 shows a second structural example of the oscillator 4. FIG. 20 shows a structural example of the oscillator 4 of an H-type package. The oscillator 4 includes the resonator 10, the circuit apparatus 20, and the package 15 that accommodates the resonator 10 and the circuit apparatus 20. The package 15 includes the base 16 and the lid 17. The base 16 includes a first substrate 6 that is an intermediate substrate, a second substrate 7 stacked on an upper surface of the first substrate 6 and having a substantially rectangular frame shape, and a third substrate 8 stacked on a bottom surface of the first substrate 6 and having a substantially rectangular frame shape. The lid 17 is bonded to an upper surface of the second substrate 7, and the resonator 10 is accommodated in an accommodation space S1 formed by the first substrate 6, the second substrate 7, and the lid 17. For example, the resonator 10 is hermetically sealed in the accommodation space S1 and is preferably in a depressurized state close to a vacuum. Accordingly, the resonator 10 can be preferably protected from impact, dust, heat, humidity, and the like. In addition, the circuit apparatus 20 which is a semiconductor chip is accommodated in an accommodation space S2 defined by the first substrate and the third substrate 8. In addition, the external terminals 18 and 19 which are electrode terminals for external coupling of the oscillator 4 are formed on a bottom surface of the third substrate 8.

In the accommodation space S1, the resonator 10 is coupled, by conductive coupling portions CDC1 and CDC2, to a first electrode terminal and a second electrode terminal (not shown) formed on the upper surface of the first substrate 6. The conductive coupling portions CDC1 and CDC2 may be implemented by conductive bumps such as metal bumps or may be implemented by conductive adhesives. Specifically, for example, a first electrode pad (not shown) formed on one end of the tuning fork type resonator 10 is coupled, via the conductive coupling portion CDC1, to the first electrode terminal formed on the upper surface of the first substrate 6. The first electrode terminal is electrically coupled to the pad PX1 of the circuit apparatus 20. In addition, a second electrode pad (not shown) formed on the other end of the tuning fork type resonator 10 is coupled, via the conductive coupling portion CDC2, to the second electrode terminal formed on the upper surface of the first substrate 6. The second electrode terminal is electrically coupled to the pad PX2 of the circuit apparatus 20. Accordingly, the one end and the other end of the resonator 10 can be electrically coupled to the pads PX1 and PX2 of the circuit apparatus 20 via the conductive coupling portions CDC1 and CDC2. In addition, conductive bumps BMP are formed on a plurality of pads of the circuit apparatus 20 which is a semiconductor chip, and the conductive bumps BMP are coupled to a plurality of electrode terminals formed on the bottom surface of the first substrate 6. The electrode terminals coupled to the pads of the circuit apparatus 20 are electrically coupled to the external terminals 18 and 19 of the oscillator 4 via an internal wiring or the like.

The oscillator 4 may be an oscillator of a wafer-level package (WLP). In this case, the oscillator 4 includes a base including a semiconductor substrate and a through electrode penetrating the semiconductor substrate between a first surface and a second surface of the semiconductor substrate, the resonator 10 fixed to the first surface of the semiconductor substrate via a conductive bonding member such as a metal bump, and an external terminal provided on the second surface side of the semiconductor substrate via an insulating layer such as a rearrangement wiring layer. An integrated circuit that is the circuit apparatus 20 is formed on the first surface or the second surface of the semiconductor substrate. In this case, a first semiconductor wafer on which a plurality of bases on which the resonator 10 and the integrated circuit are disposed are formed, and a second semiconductor wafer on which a plurality of lids are formed are bonded to each other, so that the plurality of bases and the plurality of lids are bonded to each other. Thereafter, singulation of the oscillator 4 is performed by a dicing saw or the like. In this way, the oscillator 4 of the wafer-level package can be implemented, and the oscillator 4 can be manufactured at high throughput and low cost.

As described above, in FIG. 19, the oscillator 4 includes the single seal package 15 in which the resonator 10 and the circuit apparatus 20 are accommodated in one accommodation space. According to such a single seal package, a size of the oscillator 4 can be reduced. On the other hand, in the oscillator 4 of the single seal package, since the resonator 10 and the circuit apparatus 20 are accommodated in the same accommodation space, the oscillator 4 is susceptible to heat generation. Therefore, an effect of correction by switching the temperature compensation according to the state of the output circuit 80 or the state of the external control signal as in the embodiment is improved. On the other hand, in the oscillator 4 of the H-type package as shown in FIG. 20, since the circuit apparatus 20 is in contact with outside air, an influence of heat generation of the circuit apparatus 20 is small, and the heat generation of the circuit apparatus 20 is hardly transmitted to the resonator 10. However, in the oscillator 4 of the H-type package, the method of switching the temperature compensation in the embodiment according to the state of the output circuit 80 or the state of the external control signal is still effective.

As described above, a circuit apparatus according to the embodiment includes a clock signal generation circuit configured to generate a clock signal based on an oscillation signal generated by oscillating a resonator, an output circuit configured to operate in a first state or a second state in which a consumption current is different from that in the first state and output at least one output clock signal based on the clock signal, and a temperature compensation circuit configured to, based on a temperature detection signal from a temperature sensor, compensate for a frequency-temperature characteristic of the clock signal. When the output circuit operates in the first state, the temperature compensation circuit outputs a first temperature compensation signal that compensates for the frequency-temperature characteristic when the output circuit operates in the first state, and the clock signal generation circuit generates the clock signal based on the first temperature compensation signal. In addition, when the output circuit operates in the second state, the temperature compensation circuit outputs a second temperature compensation signal that compensates for the frequency-temperature characteristic when the output circuit operates in the second state and that is different from the first temperature compensation signal, and the clock signal generation circuit generates the clock signal based on the second temperature compensation signal.

According to the embodiment, when the output circuit operates in the first state and the first consumption current flows, the clock signal temperature-compensated based on the first temperature compensation signal can be generated. In addition, when the output circuit operates in the second state and the second consumption current flows, the clock signal temperature-compensated based on the second temperature compensation signal can be generated. Therefore, compensation for the frequency-temperature characteristic of the clock signal can be performed by an appropriate temperature compensation signal corresponding to each state of the output circuit, and thus the frequency characteristic of the output clock signal can be improved.

In the embodiment, the circuit apparatus may further include a control circuit configured to receive at least one external control signal and switch between the first state and the second state of the output circuit based on the external control signal.

In this way, even when the output circuit is switched from the first state to the second state by the external control signal and the heat generation state is changed, the appropriately temperature-compensated output clock signal can be output.

In the embodiment, the control circuit may receive a first enable control signal and a second enable control signal as the at least one external control signal. The output circuit may output a first output clock signal when the first enable control signal is active, and output a second output clock signal when the second enable control signal is active.

In this way, even when the state of the output circuit is changed and the heat generation state is changed due to setting of the first enable control signal and the second enable control signal, appropriate temperature compensation can be performed by the temperature compensation signal according to the state of the output circuit.

In the embodiment, the first state may be a state in which the first output clock signal is output, and the second state may be a state in which both the first output clock signal and the second output clock signal are output.

In this way, when the state is switched from the first state in which the first output clock signal is output to the second state in which both the first output clock signal and the second output clock signal are output, the temperature compensation signal is switched from the first temperature compensation signal corresponding to the first state to the second temperature compensation signal corresponding to the second state, and the temperature compensation is performed.

In the embodiment, the output circuit may include a first buffer circuit configured to output the first output clock signal based on the clock signal, and a second buffer circuit configured to output the second output clock signal based on the clock signal. In the first state, the first buffer circuit may output the first output clock signal. In the second state, the first buffer circuit may output the first output clock signal, and the second buffer circuit may output the second output clock signal.

In this way, when the output circuit is in the first state, the first buffer circuit outputs the first output clock signal based on the clock signal temperature-compensated based on the first temperature compensation signal. On the other hand, when the output circuit is in the second state, the first buffer circuit 81 outputs the first output clock signal and the second buffer circuit outputs the second output clock signal based on the clock signal temperature-compensated based on the second temperature compensation signal.

In the embodiment, the control circuit may receive a control signal of a slew rate of the output clock signal as the at least one external control signal, and the output circuit may output the output clock signal at a first slew rate in the first state and output the output clock signal at a second slew rate in the second state.

In this way, when the slew rate is switched from the first slew rate to the second slew rate and the heat generation state of the output circuit is changed, appropriate temperature compensation according to the heat generation state can be implemented.

In the embodiment, the temperature compensation circuit may shift the first temperature compensation signal in a temperature direction to generate the second temperature compensation signal different from the first temperature compensation signal.

In this way, when the output circuit is changed from the first state to the second state and the heat generation state is changed, the clock frequency can be appropriately temperature-compensated based on the second temperature compensation signal obtained by shifting the first temperature compensation signal in the temperature direction.

In the embodiment, when the output circuit is in the second state, the temperature compensation circuit may offset the temperature detection signal from the temperature sensor to generate the second temperature compensation signal, thereby generating the second temperature compensation signal obtained by shifting the first temperature compensation signal in the temperature direction.

In this way, the second temperature compensation signal obtained by shifting the first temperature compensation signal in the temperature direction can be generated by a simple process of offsetting the temperature detection signal from the temperature sensor.

In the embodiment, the temperature compensation circuit may generate, as the second temperature compensation signal, a temperature compensation signal having at least a quadratic coefficient characteristic different from that of the first temperature compensation signal with respect to temperature.

In this way, even when the output circuit is changed from the first state to the second state, the heat generation state is changed, and the deviation in the temperature compensation corresponding to the quadratic coefficient characteristic or the like occurs, the deviation in the temperature compensation can be appropriately corrected by using the second temperature compensation signal having at least the quadratic coefficient characteristic different from that of the first temperature compensation signal.

In the embodiment, the clock signal generation circuit may include an oscillation circuit configured to generate the oscillation signal by oscillating the resonator, the temperature compensation circuit may be a temperature compensation circuit that performs analog temperature compensation, and a temperature compensation voltage of the oscillation signal may be output to the oscillation circuit as the first temperature compensation signal and the second temperature compensation signal.

With this configuration, the temperature compensation voltage is output as the first temperature compensation signal and the second temperature compensation signal to the oscillation circuit that resonates the resonator, thereby enabling analog temperature compensation for the oscillation frequency.

In the embodiment, the clock signal generation circuit may include an oscillation circuit configured to generate the oscillation signal by oscillating the resonator, and a PLL circuit configured to generate the clock signal based on the oscillation signal. The temperature compensation circuit may be a temperature compensation circuit that performs digital temperature compensation, and a frequency divider ratio setting signal of the PLL circuit is output as the first temperature compensation signal and the second temperature compensation signal.

With this configuration, the frequency divider ratio setting signal is output to the PLL circuit as the first temperature compensation signal and the second temperature compensation signal to control the frequency divider ratio, thereby enabling digital temperature compensation.

In addition, an oscillator according to the embodiment includes a resonator and a circuit apparatus. The circuit apparatus includes a clock signal generation circuit configured to generate a clock signal based on a oscillation signal generated by oscillating the resonator, an output circuit configured to operate in a first state or a second state in which a consumption current is different from that in the first state and output at least one output clock signal based on the clock signal, and a temperature compensation circuit configured to compensate for a frequency-temperature characteristic of the clock signal based on a temperature detection signal from a temperature sensor. When the output circuit operates in the first state, the temperature compensation circuit outputs a first temperature compensation signal that compensates for the frequency-temperature characteristic when the output circuit operates in the first state, and the clock signal generation circuit generates the clock signal based on the first temperature compensation signal. In addition, when the output circuit operates in the second state, the temperature compensation circuit outputs a second temperature compensation signal that compensates for the frequency-temperature characteristic when the output circuit operates in the second state and that is different from the first temperature compensation signal, and the clock signal generation circuit generates the clock signal based on the second temperature compensation signal.

According to the embodiment, when the output circuit operates in the first state and the first consumption current flows, the clock signal temperature-compensated based on the first temperature compensation signal can be generated. In addition, when the output circuit operates in the second state and the second consumption current flows, the clock signal temperature-compensated based on the second temperature compensation signal can be generated. Therefore, compensation for the frequency-temperature characteristic of the clock signal can be performed by an appropriate temperature compensation signal corresponding to each state of the output circuit, and thus the frequency characteristic of the output clock signal can be improved.

In the embodiment, the oscillator may further include a single seal package in which the resonator and the circuit apparatus are accommodated in one accommodation space.

According to the oscillator of such a single seal package, since the resonator and the circuit apparatus are accommodated in the same accommodation space, the effect of correction by switching the temperature compensation according to the state of the output circuit is improved.

Although the embodiment is described in detail above, it can be easily understood by those skilled in the art that a number of modifications are possible without substantially departing from the novel matters and effects of the disclosure. Therefore, all such modifications are within the scope of the disclosure. For example, a term cited with a different term having a broader meaning or the same meaning at least once in the description or the drawings can be replaced with the different term at any place in the description or the drawings. In addition, all combinations of the embodiment and the modifications are also within the scope of the disclosure. In addition, configurations, operations, and the like of the circuit apparatus and the oscillator are not limited to those described in the embodiment, and various modifications can be implemented.

What is claimed is:

1. A circuit apparatus comprising:
   a clock signal generation circuit configured to generate a clock signal based on an oscillation signal generated by oscillating a resonator;
   an output circuit configured to operate in a first state or a second state in which a consumption current is different from that in the first state and output at least one output clock signal based on the clock signal; and
   a temperature compensation circuit configured to, based on a temperature detection signal from a temperature sensor, compensate for a frequency-temperature characteristic of the clock signal, wherein
   when the output circuit operates in the first state,
     the temperature compensation circuit outputs a first temperature compensation signal that compensates for the frequency-temperature characteristic when the output circuit operates in the first state, and
     the clock signal generation circuit generates the clock signal based on the first temperature compensation signal, and
   when the output circuit operates in the second state,
     the temperature compensation circuit outputs a second temperature compensation signal that compensates for the frequency-temperature characteristic when the output circuit operates in the second state and that is different from the first temperature compensation signal, and the clock signal generation circuit generates the clock signal based on the second temperature compensation signal.

2. The circuit apparatus according to claim 1, further comprising:
a control circuit configured to receive at least one external control signal and switch between the first state and the second state of the output circuit based on the external control signal.

3. The circuit apparatus according to claim 2, wherein
the control circuit receives a first enable control signal and a second enable control signal as the at least one external control signal, and
the output circuit outputs a first output clock signal when the first enable control signal is active, and outputs a second output clock signal when the second enable control signal is active.

4. The circuit apparatus according to claim 3, wherein
the first state is a state in which the first output clock signal is output, and
the second state is a state in which both the first output clock signal and the second output clock signal are output.

5. The circuit apparatus according to claim 3, wherein the output circuit includes
a first buffer circuit configured to output the first output clock signal based on the clock signal, and
a second buffer circuit configured to output the second output clock signal based on the clock signal,
in the first state, the first buffer circuit outputs the first output clock signal, and
in the second state, the first buffer circuit outputs the first output clock signal, and the second buffer circuit outputs the second output clock signal.

6. The circuit apparatus according to claim 2, wherein
the control circuit receives a control signal of a slew rate of the output clock signal as the at least one external control signal, and
the output circuit outputs the output clock signal at a first slew rate in the first state, and outputs the output clock signal at a second slew rate in the second state.

7. The circuit apparatus according to claim 1, wherein
the temperature compensation circuit shifts the first temperature compensation signal in a temperature direction to generate the second temperature compensation signal different from the first temperature compensation signal.

8. The circuit apparatus according to claim 7, wherein
the temperature compensation circuit offsets, when the output circuit is in the second state, the temperature detection signal from the temperature sensor to generate the second temperature compensation signal, thereby generating the second temperature compensation signal obtained by shifting the first temperature compensation signal in the temperature direction.

9. The circuit apparatus according to claim 1, wherein
the temperature compensation circuit generates, as the second temperature compensation signal, a temperature compensation signal that has at least a quadratic coefficient characteristic different from that of the first temperature compensation signal with respect to temperature.

10. The circuit apparatus according to claim 1, wherein
the clock signal generation circuit includes an oscillation circuit configured to generate the oscillation signal by oscillating the resonator, and
the temperature compensation circuit is a temperature compensation circuit that performs analog temperature compensation, and a temperature compensation voltage of the oscillation signal is output to the oscillation circuit as the first temperature compensation signal and the second temperature compensation signal.

11. The circuit apparatus according to claim 1, wherein
the clock signal generation circuit includes
an oscillation circuit configured to generate the oscillation signal by oscillating the resonator, and
a PLL circuit configured to generate the clock signal based on the oscillation signal, and
the temperature compensation circuit is a temperature compensation circuit that performs digital temperature compensation, and a frequency divider ratio setting signal of the PLL circuit is output as the first temperature compensation signal and the second temperature compensation signal.

12. An oscillator comprising:
a resonator; and
a circuit apparatus, wherein
the circuit apparatus includes
a clock signal generation circuit configured to generate a clock signal based on an oscillation signal generated by oscillating the resonator,
an output circuit configured to operate in a first state or a second state in which a consumption current is different from that in the first state and output at least one output clock signal based on the clock signal, and
a temperature compensation circuit configured to compensate for a frequency-temperature characteristic of the clock signal based on a temperature detection signal from a temperature sensor,
when the output circuit operates in the first state,
the temperature compensation circuit outputs a first temperature compensation signal that compensates for the frequency-temperature characteristic when the output circuit operates in the first state, and
the clock signal generation circuit generates the clock signal based on the first temperature compensation signal, and
when the output circuit operates in the second state,
the temperature compensation circuit outputs a second temperature compensation signal that compensates for the frequency-temperature characteristic when the output circuit operates in the second state and that is different from the first temperature compensation signal, and
the clock signal generation circuit generates the clock signal based on the second temperature compensation signal.

13. The oscillator according to claim 12, further comprising:
a single seal package in which the resonator and the circuit apparatus are accommodated in one accommodation space.

* * * * *